United States Patent
Udrea et al.

(10) Patent No.: US 11,211,481 B2
(45) Date of Patent: Dec. 28, 2021

(54) III-V SEMICONDUCTOR DEVICE

(71) Applicant: Cambridge GaN Devices Limited, Cambourne (GB)

(72) Inventors: Florin Udrea, Cambridge (GB); Loizos Efthymiou, Cambridge (GB); Giorgia Longobardi, Cambridge (GB)

(73) Assignee: CAMBRIDGE GAN DEVICES LIMITED, Cambourne (GB)

( * ) Notice: Subject to any disclaimer, the term of this patent is extended or adjusted under 35 U.S.C. 154(b) by 61 days.

(21) Appl. No.: 16/740,996

(22) Filed: Jan. 13, 2020

(65) Prior Publication Data

US 2021/0217882 A1 Jul. 15, 2021

(51) Int. Cl.
| | |
|---|---|
| *H01L 29/778* | (2006.01) |
| *H01L 29/20* | (2006.01) |
| *H01L 29/45* | (2006.01) |
| *H01L 29/47* | (2006.01) |
| *H01L 29/66* | (2006.01) |

(52) U.S. Cl.
CPC ...... *H01L 29/7783* (2013.01); *H01L 29/2003* (2013.01); *H01L 29/452* (2013.01); *H01L 29/475* (2013.01); *H01L 29/66462* (2013.01); *H01L 29/7786* (2013.01); *H01L 29/7787* (2013.01)

(58) Field of Classification Search
CPC .................................................. H01L 29/66462
See application file for complete search history.

(56) References Cited

U.S. PATENT DOCUMENTS

2011/0215379 A1  9/2011  Ikoshi
2013/0140578 A1  6/2013  Chen-Ju et al.
(Continued)

FOREIGN PATENT DOCUMENTS

KR       20070092473 A      9/2007

OTHER PUBLICATIONS

D. Pagnano et al., "Suppression of subsliate coupling in GaN high electron mobility transistors (HEMTs) by hole injection from the p-GaN gate," Appl. Phys. Lett. 115, 203502 (2019), https://doi.org/10.1063/1.5121637, Nov. 12, 2019, 6 pages.
(Continued)

*Primary Examiner* — Grant S Withers
(74) *Attorney, Agent, or Firm* — Tucker Ellis LLP

(57) ABSTRACT

A heterojunction device, includes a substrate; a III-nitride semiconductor region located longitudinally above or over the substrate and including a heterojunction having a two-dimensional carrier gas; first and second laterally spaced terminals operatively connected to the semiconductor; a gate structure of first conductivity type located above or longitudinally over the semiconductor region and laterally spaced between the first and second terminals; a control gate terminal operatively connected to the gate structure, a potential applied to the control gate terminal modulates and controls a current flow through the carrier gas between the terminals, the carrier gas being a second conductivity type; an injector of carriers of the first conductivity type laterally spaced away from the second terminal; and a floating contact layer located over the carrier gas and laterally spaced away from the second terminal and operatively connected to the injector and the semiconductor region.

23 Claims, 14 Drawing Sheets

(56) References Cited

U.S. PATENT DOCUMENTS

2016/0035853 A1* 2/2016 Kaneko ............... H01L 29/0619
257/194
2019/0326427 A1 10/2019 Kinzer

OTHER PUBLICATIONS

K. J. Chen et al., "GaN-on-Si Power Technology: Devices and Applications," in IEEE Transactions on Electron Devices, vol. 64, No. 3, pp. 779-795, Mar. 2017.
M. J. Uren et al., "'Leaky Dielectric' Model for the Suppression of Dynamic Ron in Carbon-Doped AlGaN/GaN HEMTs," in IEEE Transactions on Electron Devices, vol. 64, No. 7, pp. 2826-2834, Jul. 2017.
Partial International Search Report from corresponding International Application No. PCT/EP2021/050561, dated Apr. 21, 2021, 22 pages.
Comanescu Constantin Forin et al.: "p-NiO-ITO Transparent Heterojunction—Preparation and Characterization"; National Institute for R&D in Microtechnology; Semiconductor Conference, IEEE, dated Oct. 15, 2012; 4 pages.

\* cited by examiner

III-V SEMICONDUCTOR DEVICE

FIELD

The present disclosure relates to semiconductor devices. Particularly, but not exclusively, the disclosure relates to hetero-structure AlGaN/GaN high electron mobility transistors or rectifiers.

BACKGROUND

Gallium Nitride (GaN) is a wide band gap material with properties that make it a suitable candidate for use in several fields of application (e.g. radio-frequency electronics, opto-electronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

In the last decade, Gallium Nitride (GaN) has increasingly been considered as a very promising material for use in the field of power devices. The application areas range from portable consumer electronics, solar power inverters, electric vehicles, and power supplies. The wide band gap of the material ($E_g$=3.39 eV) results in high critical electric field ($E_c$=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface has been found to be unstable and lose electron charge under a prior high voltage stress. This phenomenon is known as dynamic Ron or current collapse. When the device is under high voltage stress in the off-state (a high potential is present on the high voltage drain terminal with respect to the source terminal and the gate voltage is at a potential below the threshold voltage to ensure that the device is off), part of the electrons in the 2DEG are lost by trapping mechanisms in either traps in the bulk of the GaN, the transition layer (i.e. the layer placed between the substrate and the GaN buffer) or at the surface of the device. Hot carrier injection in the passivation layer, next to the gate (the control terminal) also may play a role, though this is not believed to be the major contribution to the dynamic Ron phenomenon. This loss of charge from the 2DEG layer to the surrounding traps leads to a subsequent decrease in the conductivity during on-state and thus an increase in the on-state resistance. The effect could be seen also during the switching or when the device is in operation in a real system.

One way to alleviate the increase in the on-state resistance is to inject holes during the off-state or during the on-state operation to passivate the bulk or surface traps and prevent or slow down the trapping of electrons in the vicinity of the 2DEG layer (either in the bulk or at the surface).

There are several theories describing the effect of the injected holes. One possible mechanism is that the injected holes change the electric field distribution from the 2DEG to the substrate, by moving the high fields away from the 2DEG vicinity, towards the substrate. As a result the 2DEG is exposed to lower electric fields which slows down the mechanism of electron trapping in the vicinity of the 2DEG as shown By D. Pagano et al in ["Suppression of substrate coupling in GaN high electron mobility transistors (HEMTs) by hole injection from the p-GaN gate", Appl. Phys. Lett. 115, 203502 (2019), https://doi.org/10.1063/1.5121637]. Note that in the presence of injected holes, the 2DEG still depletes at high voltages during off-state and at very high voltages (closer to nominal breakdown) the whole of the 2DEG is depleted, but the peak of the electric field is moved away from the 2DEG towards the substrate.

IKOSHI et al., US 2011/0215379 A1 patent application describes a p-type injector placed at the surface of the semiconductor which is connected to a hole injector electrode having virtually the same potential as that of the drain. The patent describes embodiments where the hole injector is connected via metallization to the drain electrode. Other embodiments, all based on a hardwired injection electrode placed on a p-type injector region, describe placing the p-injector region inside the drift region, between the gate and the high voltage terminal (drain), or outside the drift region, in the close proximity of the high voltage terminal (drain).

KINZER et al., US 2019/0326427 A1 patent application describes a p-type injector placed between the gate and the drain terminals, which is not in direct electrical contact to the drain electrode but capacitively connected to it. The p-injector can inject holes via displacement currents flowing through the dielectric layer (acting as the dielectric of a capacitor). The device injects holes only during the transient, but not under steady-state during the on-state or off-state conditions. The amount of injection is also limited by the transient dV/dt current and the capacitance of the dielectric layer.

When the p-injector is connected to an electrode, as described in IKOSHI et al., US 2011/0215379 A1 patent application, it leads to undesirable off-state vertical and lateral leakage in the device. This is particularly the case at very high off-state voltages. Vertical leakage is known to be present at high voltages and to dominate the total leakage current. Often the breakdown in such lateral HEMTs is not set by an avalanche condition but by the high leakage current, especially at high temperatures. Vertical leakage current is increased by the presence of the hole current, particularly for high off-state voltages.

On the other hand, by capacitively connecting the p-injectors, as described in KINZER et al., US 2019/0326427 A1, the device can only inject holes during fast transient conditions and the current is limited by the capacitance value. As such, the hole current injected may be insufficient to passivate the charge, unless a very large area for the capacitive injector is used, which adds cost and leads to degradation in the overall performance.

FIG. 1 shows schematically the cross section in the active area of a pGaN HEMT in prior art. Following a period of off-state stress the phenomenon of dynamic Ron (or current collapse) is observed due to the trapping of electrons in either traps in the bulk of the GaN 2, the transition layer 3 (i.e. the layer placed between the substrate and the GaN buffer) or at the surface of the device (often the interface between region 1 and 6). The dynamic Ron is manifested through a decrease in the current for a given gate potential higher than the threshold voltage and drain potential, when the device was subjected to a prior high voltage off-state stress.

[K. J. Chen et al., "GaN-on-Si Power Technology: Devices and Applications," in IEEE Transactions on Electron Devices, vol. 64, no. 3, pp. 779-795, March 2017.]

[M. J. Uren et al., "Leaky Dielectric" Model for the Suppression of Dynamic Ron in Carbon-Doped AlGaN/GaN HEMTs," in IEEE Transactions on Electron Devices, vol. 64, no. 7, pp. 2826-2834, July 2017.]

SUMMARY

FIG. 2 shows schematically the cross section in the active area of a pGaN HEMT where an additional electrode (a fourth terminal at the surface of the device) is connected to a p-type injector. This electrode, could be connected to a different potential compared to the drain. The potential and the current through the electrode could be provided by an external circuit (which could be part of the driver) which could control its operation as to compensate for the dynamic Ron. The control sequence could be pre-determined (for example being on at certain drain voltages in the off-state) or could have a feedback from a circuit estimating the Ron in certain conditions and determine if Ron degrades and as a result injecting current into the hole injector electrode.

While the configuration described above could solve the dynamic Ron, the use of a four terminal device and the control of the p-injector electrode by an additional circuit could complicate the driving circuit of the transistor and therefore be less attractive from a system perspective.

It is the object of this disclosure to provide a p-type injector in a different structure/configuration setup that operates as a hole injector both in steady-state and during the high voltage transients of the drain terminal, but it is not hardwired or physically wired to an external hole injector electrode. The aim is to prevent the depletion of the 2DEG in the on-state when a previous high voltage stress condition was applied, but limiting and/or preventing the injection of holes at larger off-state drain voltages, which could otherwise significantly increase the leakage currents and/or limit the maximum voltage allowed in the off-state (equivalent to a breakdown voltage).

According to a first aspect of the invention, there is provided a III-nitride semiconductor based heterojunction device, comprising a substrate; a III-nitride semiconductor region located longitudinally above or otherwise over the substrate, wherein the III-nitride semiconductor region comprises a heterojunction comprising at least one two-dimensional carrier gas; a first terminal operatively connected to the III-nitride semiconductor region; a second terminal operatively connected to the III-nitride semiconductor region and laterally spaced from the first terminal; a gate structure located above or otherwise longitudinally over the III-nitride semiconductor region and laterally spaced between the first and second terminals, the gate structure being a first conductivity type; a control gate terminal operatively connected to the gate structure, wherein a potential applied to the control gate terminal modulates and controls a current flow through the two-dimensional carrier gas between the first and second terminals, the at least one two-dimensional carrier gas being a second conductivity type; at least one injector of carriers of the first conductivity type laterally spaced away from the second terminal; and a floating contact layer located over the two dimensional carrier gas and operatively connected to the at least one injector and the III-nitride semiconductor region, wherein the floating contact layer is laterally spaced away from the second terminal.

In general, references to longitudinal and lateral positions and/or distances are references to positions and distances in the longitudinal and lateral dimensions respectively. The floating contact layer is not electrically connected to an external electrode or biased externally during the on-state and/or off-state operation of the device.

Optionally, a lateral spacing between the at least one injector and the second terminal may be less than a lateral spacing between the at least one injector and the first terminal. In other words, the one or more injectors may be positioned closer to the second terminal than the first terminal in the lateral dimension, or otherwise positioned proximal to or in the vicinity of the second terminal.

We also disclose herein a III-nitride semiconductor based heterojunction device, comprising: a substrate; a III-nitride semiconductor region formed over the substrate, wherein the III-nitride semiconductor region comprises a heterojunction comprising at least one two-dimensional carrier gas of the first conductivity type; a first terminal operatively connected to the III-nitride semiconductor region; a second terminal operatively connected to the III-nitride semiconductor region and laterally spaced from the first terminal, a gate structure with a control gate terminal placed above the III-nitride semiconductor region, and laterally spaced between the first and the second terminal where the potential applied to the control terminal modulates and controls the current flow through the two-dimensional carrier gas between the first and the second terminal; a floating contact layer operatively connected to the III-nitride semiconductor region, placed above the two dimensional carrier gas and laterally spaced away from the second terminal; at least one injector of carriers of the second type conductivity placed in the vicinity of the second terminal, and laterally spaced away from the second terminal, where the at least one said injector is connected electrically to the floating contact.

Optionally, at least one portion of the at least one two-dimensional carrier gas of the second conductivity type may be present between the second terminal and the floating contact. The portion of the at least one two-dimensional carrier gas may provide a conductive path made of carriers of the second conductivity type between the second terminal and the floating contact layer. In other words, this two-dimensional carrier gas, when present (i.e. when not depleted), provides a conductive path made of carriers of the second conductivity type between the second terminal and the floating contact (of the floating contact layer).

In some embodiments, when in operation the at least one portion of the at least one two-dimensional carrier gas type may at least partially deplete upon application of a potential to the second terminal significantly greater than a potential to the first terminal. In other words, if the difference in applied potentials is high enough, the portion of the two-dimensional carrier gas which connects the contact of the second terminal to the contact of the floating contact layer may be completely depleted.

In one embodiment, the device may be a high electron mobility transistor (HEMT); one or more of the at least one two-dimensional carrier gas may be a two-dimensional electron gas (2DEG); the first terminal may be the source terminal; and the second terminal may be the drain terminal. One or more of the at least one injector of carriers of the second type conductivity may be a hole injector, also known as a p-injector of holes. The 2DEG is formed at the interface of the heterojunction comprised for example of two layers, GaN and AlGaN. Other heterojunction layers comprising at least two material with different bandgaps are possible.

The p-injector could be formed of any III-Nitride layer such as Gallium Nitride (GaN) material or Aluminium Gallium Nitride (AlGAN) material. The p-type dopant may be, for example, Magnesium, but the skilled person will understand that other p-type dopants may be utilized in addition to or instead of a Magnesium p-type dopant. The p-injector could be formed within one of the existing layer as part of the existing heterojunction (GaN or AlGaN) by doping with p-dopant a particular region of that layer or could be grown or regrown or formed by deposition as an additional III-nitride layer. The p-injector could be for example made of a p-type doped GaN material grown selectively on top of the AlGaN layer.

In some embodiments, one or more of the floating contact layer, the first terminal and the second terminal may be configured to be operatively connected to at least a portion of the at least one two-dimensional carrier gas. Optionally, some or all of these operative connections to the two-dimensional carrier gas may be electrical connections.

The gate structure may be formed by p-type region (recessed or non-recessed, grown or regrown), as known in state-of-the-art p-Gate HEMTs and connected to the gate terminal through an ohmic or Schottky metallization. Advantageously, in this embodiment a normally-off HEMT may be realized with a positive threshold voltage. The p-type dopant may be, for example, Magnesium, but the skilled person will understand that other p-type dopants may be utilized in addition to or instead of a Magnesium p-type dopant.

The gate structure may be comprised of a p-type gate and the electrical contact to the p injector of the floating contact layer may be similar in nature to the electrical contact made by the gate control terminal to the p-type gate. The p-type gate region may be made or formed in the same process step as the p-injector region. Alternatively, the p-type gate region and the p-injector region may be formed in separate process steps. In embodiments with a plurality of p-type gate regions and/or a plurality of p-injector regions, any or all of these regions may be formed in the same or separate process steps.

Alternatively, the gate structure may be made or formed of recessed or non-recessed insulating layer above which the gate terminal is placed. This is known state-of-the-art MIS-FETs (Metal Insulating FETs). MISFETs may be either normally-off or normally-on transistors.

Alternatively, the gate structure could be made of a Schottky metal directly placed on the III-Nitride region. In this case a normally-on transistor (also known as a depletion mode transistor) is formed with a negative threshold voltage.

By being operatively connected to the III-nitride region, the first terminal, the second terminal and the floating contact layer make an electrical contact to the 2DEG layer or portions of the 2DEG. The contacts of the first terminal and the second terminal to the 2DEG is preferably ohmic, as known in prior art. The floating contact layer may make an ohmic contact to the two-dimensional carrier gas placed below, as well as, or alternatively, making an ohmic contact to the hole injector. Alternatively, a Schottky contact is also possible to either or both the two-dimensional carrier gas placed below and the hole injector.

As a result, in a further embodiment, the floating contact layer may have or be an ohmic contact or a Schottky contact with one or more of the at least one two-dimensional carrier gas and the at least one injector. In other words, the floating contact layer may make an ohmic contact to the two-dimensional carrier gas placed below and/or make an ohmic contact to the hole injector. Alternatively or in addition to this ohmic contact, the floating contact layer may make a Schottky contact to the two-dimensional carrier gas placed below and/or the hole injector.

The floating contact layer may comprise at least one isolated metal layer that is not operatively connected to any electrodes or terminals. More generally, the floating contact layer may be an isolated metal layer or split in several isolated metal layers which are not connected to any other electrodes or terminals. The isolated metal layer or layers may be made or formed in the same process step as one or more of the other metal layers in the process, such as those used for the source, drain or gate terminals. Alternatively, any or all of the isolated metal layers may be made or formed in a separate process step.

Alternatively, the floating contact layers may be made out of very thin, very conductive layers, such as metal silicides or other materials similar to metals.

The contact to the 2DEG of the floating contact layer may be similar to the contact made by source or drain to the 2DEG. Such contact may be established in the same process step and using the same mask as those done for the source and the drain. For example, in some embodiments a trench or a recess may be provided for the metallization of one or more of the first and second terminals and the floating contact layer, such that a direct connection is established between the one or more of the first and second terminals and the floating contact layer and their respective portions of the at least one two-dimensional carrier gas The contact to the p-injector of the floating contact layer may be similar to the contact made by the p-type gate (in case of p gate HEMT). Such contact may be established in the same process step and using the same mask as that done for the p-type gate.

The injector of holes need not be connected physically to any hole injector electrode (or the drain terminal), and in some embodiments may only be electrically connected to the floating contact layer that also connects part of the 2DEG. A portion of the 2DEG connects the second terminal (drain) to the floating contact. When the second terminal (drain) is positively biased with respect to the first terminal, a current made of electrons flows from the second terminal through the portion of the 2DEG that connects the second terminal (drain) to the floating contact. Note that electrons have negative charge and the actual electron carriers move in the opposite direction to the current. The floating contact layer (i.e. metallization region that is not connected to any external electrodes) converts the electron carriers into hole carriers. In other words, the current made of electrons is now converted into an equal or substantially equal current made of holes with the p—injector acting as a source of holes (i.e. provider/injector of holes). The holes are then injected back into the III-Nitride region from the p-injector region. This injection is particularly prominent during the off-state stress or during the transient while the drain voltage raises. However, at very high gate voltages, the 2DEG portion between the second terminal (drain) and the floating contact gets depleted. As a result, there are no more electrons flowing into the floating contact which would otherwise be converted into holes and re-injected as leakage into the structure. The outcome is a lower leakage current at high voltages than in the case where the p-injector would have been hardwired to a hole injector electrode (e.g., drain).

The floating contact layer (in combination with the p-injector) is configured to convert electrons from the 2DEG into holes from the p-injector and therefore acts as an electron to hole converter. In some embodiments, this means that a current of the holes injected by the at least one p-injector is approximately, substantially or exactly equal to a current of electrons between the drain terminal and the floating contact layer. The current of electrons between the drain terminal and the floating contact layer may flow via a portion of the one or more 2DEG. In general, the floating contact layer making an electrical and/or physical connection to the 2DEG and the p-injector may act as an electron to hole converter. The hole injection provided through the floating electrode converter by the p-injector (source of holes) is very effective in passivating the traps in the III-Nitride region or moving the depletion region away from the 2DEG placed between the source and the drain during the off-state stress. Thus, as a consequence of hole injection, the device does not suffer or suffer less from the dynamic Ron (or current collapse) phenomena. Moreover, as the floating electrode is not hard-wired to any external electrode or the drain terminal, at very high voltages, as the 2DEG portion between the floating electrode and the drain terminal may get depleted by the strong vertical electric field (created during the application of the high potential on the drain with respect to the substrate) and the hole injection becomes weaker and eventually stops. This has the extra benefit of reducing the overall leakage during very high voltages or increasing the breakdown of the device (defined here by when the leakage at the maximum junction temperature reaches a maximum acceptable leakage current).

In one embodiment, an injection of carriers of the first conductivity type (holes) may occur when an off-state voltage is applied to the second terminal with respect to the first terminal or during the transient while the voltage of the second terminal rises. In other words, the hole injector may inject holes during the off-state, when high voltage stress is provided (high voltage on the second terminal). This is done by converting the electrons flowing through a portion of the 2DEG into holes, with the help of the floating contact metal which acts as a carrier converter. Alternatively or in addition, an injection of carriers of the first conductivity type may occur during an on-state of the device. This means that hole injection may occur in the on-state in addition to or instead of hole injection in the off-state. This may occur as the second terminal (drain) is at slightly higher potential than the source. This injection will be however limited as the potential difference between the terminals is significantly smaller than in the off-state. This on-state hole injection may however be significant in the scenario where trapped electrons, and therefore a region of negative charge, persist in the GaN buffer after a period of off-state bias. Injection of holes can also happen during the transient regime (i.e. turn-off) as the potential on the second terminal rises in time.

Recombination of holes with electrons in the 2DEG can occur. Tunnelling or thermionic emission or a combination of both tunnelling or thermionic emission of holes through the AlGaN layer (e.g. the top layer of the III-Nitride region) and eventually the 2DEG layer to reach traps placed below the 2DEG layer can occur. The injection of holes is stronger when the 2DEG layer is depleted. 2DEG gets depleted when the potential on the second terminal rises with respect to the first terminal and it is completely depleted at very high potentials.

Optionally, the at least one injector is recessed below the surface of the III-nitride semiconductor region. In general, a recess may be provided for the p injector, so that the p injector is closer to the 2DEG or below the 2DEG to facilitate easier injection of holes. The p injector could be made of a GaN material, which could be grown or regrown after a recess is carried out.

Optionally, the operative connection of the floating contact layer to the III-nitride semiconductor region may be laterally spaced between the first and second terminals. Alternatively, the operative connection of the floating contact layer to the III-nitride semiconductor region may be laterally spaced outside of a region between the first and the second terminals. In other words, the actual contact of the floating contact layer may be placed within the drift region or outside the drift region, in the close vicinity of the drain.

In addition to or alternatively from the above, any or all of the at least one injectors may be laterally spaced between the first and second terminals. Alternatively or in addition, any or all of the at least one injectors may be laterally spaced outside of a region between the first and the second terminals. In other words, the p-injector region could be placed within the drift region (laterally spaced between the first and the second terminal) or outside the drift region (laterally spaced outside the region between the first terminal and the second terminal), in the close vicinity of the drain.

The p injector and the floating contact can be inserted anywhere laterally between the first and the second terminal or outside the region between the first and the second terminal but in the proximity of the second terminal. The injection of holes becomes higher when the electric field reaches the p-injector. The portion of the 2DEG under the p-injector may deplete first (or may be already be depleted due to the p-region), before the portion of the 2DEG which connects the contact of the floating contact layer and the drain depletes at higher voltages. This facilitates the injection of holes. Such holes are provided by the electron to hole converter (i.e. floating contact layer). The electrons which convert to holes are provided through the portion of the 2DEG which connects the contact of the floating contact layer and the drain.

Placing the p-injector and the floating contact layer laterally between the first and the second terminal closer to the first terminal, would allow the hole injection to become stronger at lower potentials applied to the drain. Several such p injector/floating contact structures can be placed laterally between the first and the second terminal. The downside of placing one or more of such p-injector/floating contact structures inside the drift region is that right under the p-injector regions the 2DEG locally is weakened and this may increase statically the on-state resistance of the device. Placing islands of such structures in the third dimension help to alleviate this effect. Alternatively such structures may be placed just outside the drift region under the drain metallization (but as described in this invention not having a physical connection to the drain metallization). Alternatively, to alleviate the detrimental effect of placing p-injectors (or p-injector islands) inside the drift region, between source and drain on the 2DEG charge strength between the source and drain, regions of n type (grown or doped with n-type dopants) could be placed under such p-islands, to increase the strength of the 2DEG under the p-injectors or p-injector islands. Alternatively, AlGaN regions with higher mole fraction or higher thickness could be grown or regrown under such p-injector regions. The higher mole fraction or the higher the thickness of the AlGaN, the higher the strength of the 2DEG in that region.

In some embodiments, the device may include a plurality of injector islands in a third dimension, wherein said plurality of injector islands are either (i) all connected to a single floating contact layer or (ii) each connected to at least one of a plurality of single floating contact layers. This means that each of the two or more injectors may be displaced from one another along (or proximate to/in vicinity of) an axis normal to the longitudinal and lateral dimensions (i.e. an axis of the third dimension). Multiple p-injector islands in the third dimension could be displaced within the drift region or outside the drift region. In some embodiments, some or all of the p-injector islands may be proximate to or in the close vicinity of the drain terminal, or otherwise closer to the drain terminal than the source terminal in the lateral dimension. Such regions may be connected to multiple floating contact layers or to a single floating contact layer.

The 2DEG portion between the drain terminal and the contact of the floating contact layer may be within the drift region or outside the drift region, in the close vicinity of the drain.

In some embodiments, the floating contact layer and a portion of the at least one two-dimensional carrier gas between the operative contact of the floating contact layer to the III-nitride semiconductor region and the second terminal are in a second active area of the device, wherein the second active area of the device is isolated from a first active area of the device comprising the first and second terminals; optionally either (i) the portion of the at least one two-dimensional carrier gas in the second active area is in contact with or a continuation of the at least one two-dimensional carrier gas in the first active area, or (ii) the portion of the at least one two-dimensional carrier gas in the second active area is isolated or otherwise separated from the at least one two-dimensional carrier gas in the first active area. In other words, one or more p type injector region may be placed outside the main active area of the device, inside its own isolated active area. In this case, one or more of the floating contact layer and the 2DEG portion between the drain terminal and the contact of the floating contact metal a may also be placed outside the main active area in another, second, isolated active area of the device. Such isolated areas could be placed, for example, at the edge of the device or alternatively in the vicinity of or even right under the drain pad or terminal.

This means that the 2DEG formed between the contact of the floating contact layer and the drain may be in contact with or a continuation of the 2DEG formed between the source and the drain terminals. Alternatively, the 2DEG formed between the contact of the floating contact layer and the drain may be separated, isolated or not in direct contact to the 2DEG formed between the source and the drain terminals.

In a further embodiment, one or more of the at least one injector, the floating contact layer and a portion of the at least one two-dimensional carrier gas between the operative contact of the floating contact layer to the III-nitride semiconductor region and the second terminal is located below a drain pad.

In one embodiment, one or more second floating p-type region may be laterally spaced between the second terminal and the contact of the floating contact layer, or otherwise formed between the first and second terminals in the lateral dimension. A second floating p-type region may be inserted laterally between the drain and the contact of the floating contact metal. This second floating region weakens the charge of the portion of the 2DEG between the drain metal and the actual contact of the floating contact layer. This in turn would facilitate the depletion of this portion of the 2DEG when a very high voltage is present on the drain terminal.

Optionally, the first terminal and the gate control terminal may be operatively connected. In other words, the first terminal and the control terminal could be connected together. In this case a diode could be formed. Such diode could be a separate device or integrated with the HEMT monolithically. The p-injector according to this invention in this case would allow to minimise the on-state loss of conductivity when the diode is forward-biased and when previously was exposed to a high voltage stress during reverse-bias.

The device described above according to this invention can operate in the low side or high side. In the high side, both the first terminal and the second terminal could operate at elevated potentials. A half bridge based on a low side device in series with a high side device according to this invention could be monolithically integrated.

According to a second aspect of the present disclosure, there is provided a III-nitride semiconductor based heterojunction device, comprising a substrate; a III-nitride semiconductor region located over the substrate, wherein the III-nitride semiconductor region comprises a heterojunction comprising at least one two-dimensional carrier gas; a first terminal operatively connected to the III-nitride semiconductor region and forming a Schottky or an ohmic contact to the at least one two-dimensional carrier gas; a second terminal operatively connected to the III-nitride semiconductor region and laterally spaced from the first terminal, forming a Schottky or an ohmic contact to the at least one two-dimensional carrier gas; at least one injector of carriers of a first conductivity type laterally spaced away from the second terminal; and a floating contact layer located over the two dimensional carrier gas and operatively connected to the at least one injector and the III-nitride semiconductor region, wherein the two-dimensional carrier gas is of a second conductivity type.

We further describe a III-nitride semiconductor based heterojunction device, comprising: a substrate; a III-nitride semiconductor region formed over the substrate, wherein the III-nitride semiconductor region comprises a heterojunction comprising at least one two-dimensional carrier gas of the first conductivity type; a first terminal operatively connected to the III-nitride semiconductor region and forming a Schottky or an ohmic contact to the two-dimensional carrier gas; a second terminal operatively connected to the III-nitride semiconductor region laterally spaced from the first terminal, forming an ohmic contact to the two-dimensional carrier gas; a floating contact layer operatively connected to the III-nitride semiconductor region placed above the two dimensional carrier gas and laterally spaced away from the second terminal, an injector of carriers of the second type conductivity placed in the vicinity of the second terminal, and laterally spaced away from the second terminal, where the at least one said injector is connected electrically to the floating contact layer.

In an embodiment of the second aspect, the device may be a diode or a high voltage diode (when the first terminal makes a Schottky to the 2DEG) or a simple resistor. The p-injector according to the invention in this case may allow the on-state loss of conductivity to be minimised when the diode is forward-biased and when previously exposed to a high voltage stress during reverse-bias.

Preferably, the starting substrate in either aspect of the invention may be silicon. However, any other substrate combining silicon with another semiconducting material compatible with state-of-the-art fabrication processes may be used. Employment of a silicon substrate facilitates etching techniques, low cost, high reproducibility, and wide availability of foundries supporting the process. Alternative substrate materials may include sapphire, silicon carbide (SiC), gallium nitride (GaN), and gallium arsenide (GaAs). Other alternatives may also be possible. Also, this disclosure covers the possibility of growing the III-nitride semiconductor region comprising the heterojunction (or heterostructure) on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The semiconductor layers forming any of the heterostructures included in this disclosure may be formed using any one of Metal-Organic Chemical Vapour Deposition (MOCVD) and Molecular Beam Epitaxy (MBE) growth techniques. Other alternative growth techniques may also be possible.

The heterojunction of the III-nitride semiconductor region may comprises: a first III-nitride semiconductor layer having a first band gap formed over the substrate; a second III-nitride semiconductor layer having a second bandgap different from the first band gap disposed on the first III-nitride semiconductor layer; and at least one two-dimensional carrier gas formed at the interface between the first and second III-nitride semiconductor layers to provide a channel.

The first III-nitride semiconductor layer may comprise any one of gallium nitride (GaN), aluminium gallium nitride (AlGaN) and indium aluminium gallium nitride (InAlGaN); and the second III-nitride semiconductor layer may comprise any one of gallium nitride (GaN), aluminium gallium nitride (AlGaN) and indium aluminium gallium nitride (InAlGaN). The p injector may comprise any one of gallium nitride (GaN), aluminium gallium nitride (AlGaN) and indium aluminium gallium nitride (InAlGaN) and may be doped with Magnesium.

The heterostructure may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably, the heterostructure will be an AlGaN/GaN heterostructure comprising a two dimensional electron gas (2D carrier gas); this will be used for illustrative purposes in the embodiments hereafter and in the accompanying drawings. GaN and AlGaN technology allows transistors with high electron mobility and high saturation velocity to be designed.

The two-dimensional carrier gas may be a two-dimensional electron gas (2DEG) or a two dimensional hole gas (2DHG). The 2DEG has a considerably higher carrier mobility and is therefore preferred to a 2DHG.

The first terminal, the second terminal and the floating contact layer may be in contact with the III-nitride semiconductor region. Preferably the contact will be at the surface of the semiconductor and in physical touch with the second III-nitride semiconductor layer of the III-nitride semiconductor region. Alternatively, a trench or a recess could be provided such that a direct physical touch of either of the first terminal, second terminal or the floating contact layer could be established to their respective portions of the 2DEG. This would facilitate a better ohmic contact to such portions of the 2DEG layer. As already mentioned, the p-injector could be recessed as well to provide better injection access to the traps under the main 2DEG.

The device may further comprise a transition layer formed between the substrate and the III-nitride semiconductor region. The transition layer may be present between the heterostructure and the bulk substrate to minimise the lattice mismatch or accommodate the mechanical stress in the heterostructure. The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In embodiments of the disclosure where the substrate is silicon and the heterostructure is based on III-Nitride compounds such as GaN, the transition layer may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The device may be a normally-off device, a normally-on device (threshold voltage is negative) or a diode.

According to a further aspect of the present disclosure, there is provided a method of manufacturing a III-nitride semiconductor based heterojunction device, the method comprising forming a substrate; forming a III-nitride semiconductor region located over the substrate, wherein the III-nitride semiconductor region comprises a heterojunction comprising at least one two-dimensional carrier gas; forming a first terminal operatively connected to the III-nitride semiconductor region; forming a second terminal laterally spaced from the first terminal in a first dimension and operatively connected to the III-nitride semiconductor region; forming a gate terminal on a gate structure, said gate structure being positioned above the III-nitride semiconductor region; forming a floating contact layer over the at least one two dimensional carrier gas, wherein the floating contact layer is operatively connected to the III-nitride semiconductor region and laterally spaced away from the second terminal; forming at least one injector of carriers of a first conductivity type laterally spaced away from the second terminal; and forming at least one operative connection between the at least one said injector and the floating contact layer.

We further describe a method of manufacturing a III-nitride semiconductor based heterojunction device, the method comprising: forming a substrate; forming a III-nitride semiconductor region formed over the substrate, wherein the III-nitride semiconductor region comprises a heterojunction comprising at least one two-dimensional carrier gas of the second conductivity type; forming a first terminal operatively connected to the III-nitride semiconductor region; forming a second terminal laterally spaced from the first terminal in a first dimension and operatively connected to the III-nitride semiconductor region; forming a gate terminal on a gate structure placed above the III-nitride semiconductor region; forming a floating contact layer operatively connected to the III-nitride semiconductor region, placed above the two dimensional carrier gas and laterally spaced away from the second terminal; forming an injector of carriers of the second type conductivity placed in the vicinity of the second terminal, and laterally spaced away from the second terminal, where the at least one said injector is connected electrically to the floating contact layer.

Optionally, the gate structure is formed of p type material and the p injector is formed in the same process step as the gate structure.

Optionally, the metal layer or layers used for the floating contact layer can be done in the same process step as one of the other metal layers in the process, such as those used for the first terminal, second terminal or the gate control terminal.

BRIEF DESCRIPTION OF THE DRAWINGS

The present disclosure will be understood more fully from the accompanying drawings, which however, should not be taken to limit the disclosure to the specific embodiments shown, but are for explanation and understanding only.

FIG. 6B shows a schematic representation of a cross section of the active area of the proposed disclosure (x, y axis) along the cutline shown in the top view;

FIG. 7 shows a schematic representation of a cross section of the active area of the proposed disclosure (x, y axis) along the cutline shown in the top view;

FIG. 9B shows a schematic representation of a cross section of the active area of the proposed disclosure (x, y axis) along the cutline shown in the top view;

FIG. 10 shows a schematic representation of a cross section of the active area of the proposed disclosure (x, y axis) along the cutline shown in the top view;

FIG. 11 shows a schematic representation of a cross section of the active area of the proposed disclosure (x, y axis) along the cutline shown in the top view;

FIG. 12 shows a schematic representation of a cross section of the active area of the proposed disclosure (x, y axis) along the cutline shown in the top view;

FIG. 13 shows a schematic representation of a cross section of the active area of the proposed disclosure (x, y axis) along the cutline shown in the top view;

DETAILED DESCRIPTION OF THE PREFERRED EMBODIMENTS

Figure 1:
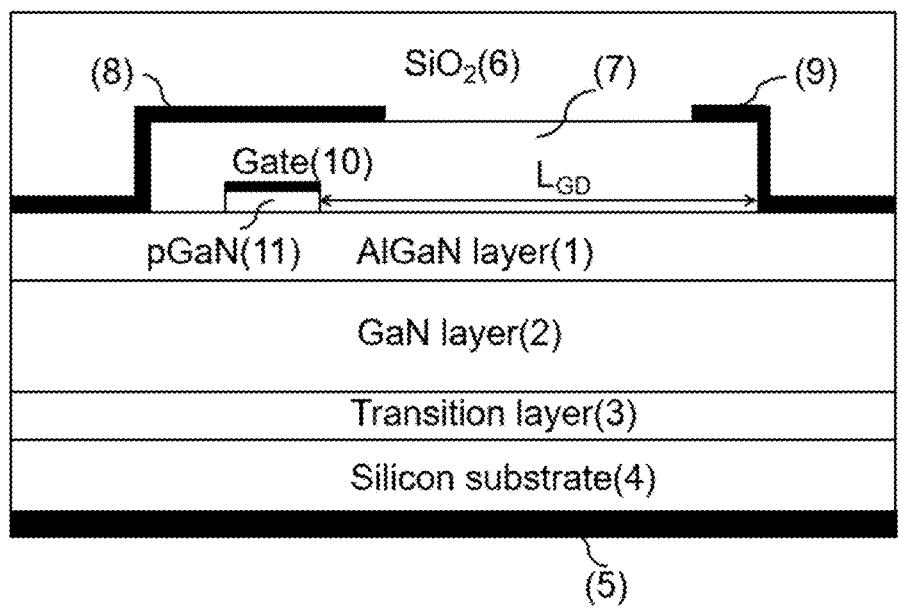
FIG. 1 shows schematically the cross section in the active area of a pGaN HEMT in prior art.
Figure 2:
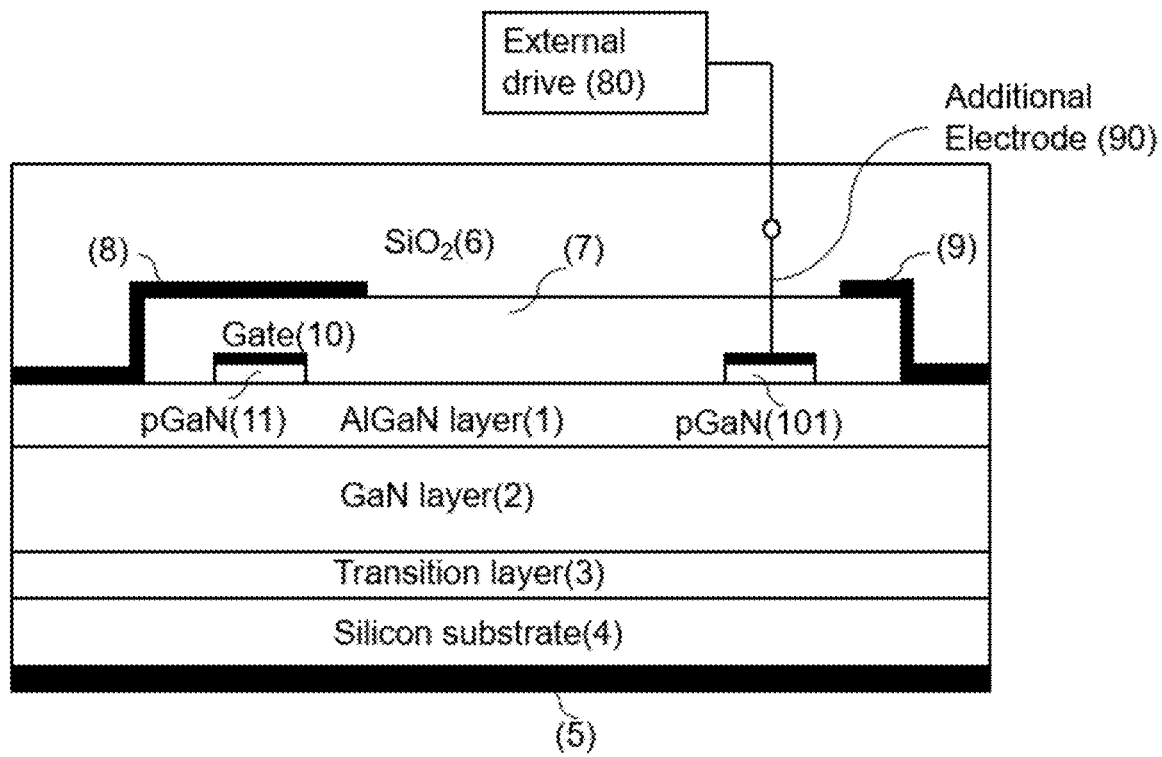
FIG. 2 shows schematically the cross section in the active area of a pGaN HEMT with an additional hole injector electrode driven by an external drive.
Figure 3:
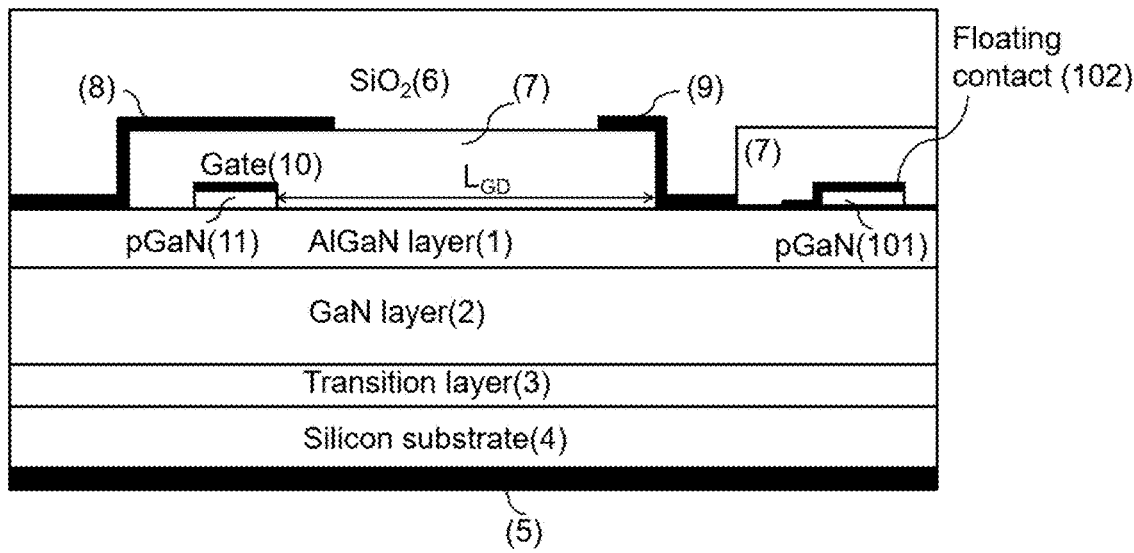
FIG. 3 illustrates a schematic representation of a cross section of the active area of the proposed disclosure according to one embodiment of the disclosure where the p-injector region is placed outside the drift region.

FIG. 3 illustrates a schematic representation of a cross section of the active area of the proposed disclosure according to one embodiment of the disclosure where the p-injector region 101 is placed outside the drift region. In use, the current flows in the active area of the semiconductor device. In this embodiment, the device comprises a semiconductor (e.g. silicon) substrate 4 defining a major (horizontal) surface at the bottom of the device. Below the substrate 4 there is a substrate terminal 5. The device includes a first region of a transition layer 3 on top of the semiconductor substrate 4. The transition layer 3 comprises a combination of III-V semiconductor materials acting as an intermediate step to allow the subsequent growth of regions of high quality III-V semiconductor materials. On top of the transition layer 3 there exists a second region 2. This second region 2 is of high quality III-V semiconductor (for example GaN) and comprises several layers. A third region 1 of III-V semiconductor containing a mole fraction of Aluminium is formed on top of the second region 2. The third region 1 is formed such that a hetero-structure is formed at the interface between the second 2 and third region 1 resulting in the formation of a two dimensional electron gas (2DEG).

A fourth region of highly p-doped III-V semiconductor 11 is formed in contact with the third region 1. This has the function of reducing the 2DEG carrier concentration when the device is unbiased and is pGaN material (preferably made of GaN and doped with Magnesium) in this embodiment. A gate control terminal 10 is configured over the fourth region 11 in order to control the carrier density of the 2DEG at the interface of the second 2 and third region 1. A high voltage drain terminal 9 is arranged in physical contact with the third region 1. The high voltage drain terminal forms an ohmic contact to the 2DEG. A low voltage source terminal 8 is also arranged in physical contact with the third region 1 and also forms an ohmic contact to the 2DEG.

A first portion of surface passivation dielectric 7 is formed on top of the fourth region 11 and between the drain terminal 9 and source terminal 8. A p-injector region 101, preferably made using the same material as the pGaN gate 11, is also formed in contact with third region 1 possibly in the same step as fourth region 11. A floating contact layer 102 is formed in contact with both the p-injector region 101 and third region 1. A second portion of surface passivation dielectric 7 is formed on top of the p-injector region 101, and may be separate from or connected with the first portion of surface passivation dielectric. A layer of SiO2 or nitride or another oxide-nitride playing the role of a passivation layer 6 is formed above the surface passivation dielectric 7 and source and drain terminals 8, 9.

The injector of holes 101 is not connected physically to any hole injector electrode (or the drain terminal 9) but only physically (electrically) connected to the floating contact 102 that also connects a part or a portion of the 2DEG. A portion of the 2DEG connects the second terminal (drain) 9 to the floating contact 102. This is illustrated in FIG. 4A which shows the 2DEG present in the region beneath the drain terminal and the floating contact.

Figure 4A:
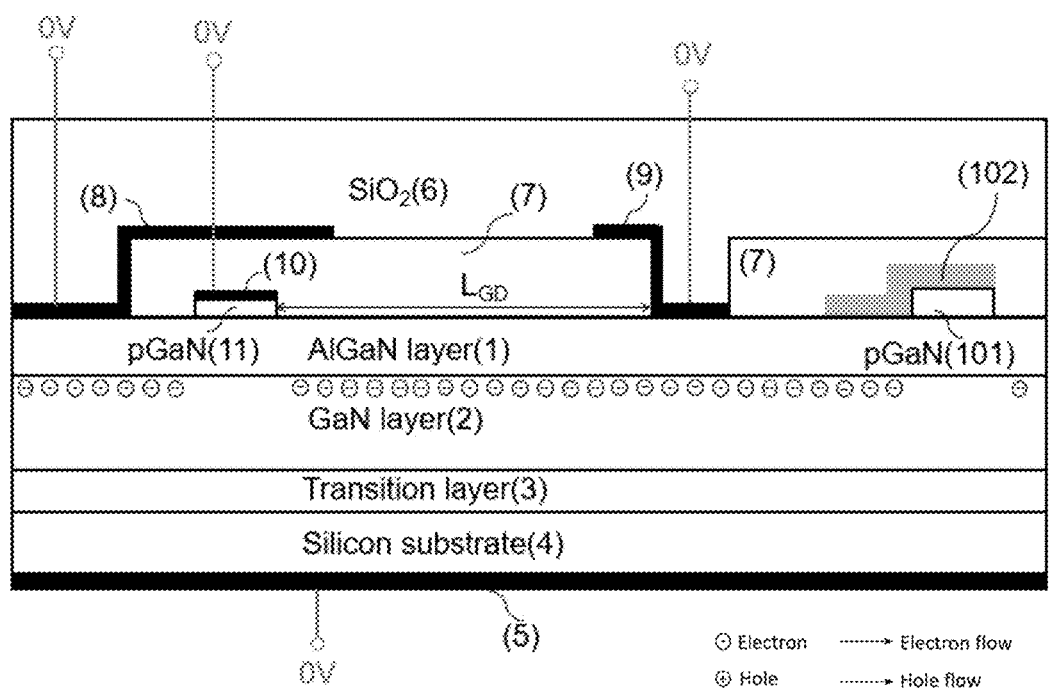
FIG. 4A illustrates a schematic representation of a cross section of the active area of the proposed disclosure according to one embodiment of the disclosure where all electrodes are at zero bias.

FIG. 4A illustrates a schematic representation of a cross section of the active area of the proposed disclosure according to one embodiment of the disclosure. In this configuration, all electrodes (8, 9 and 10), as well as the substrate terminal 5, are at zero bias. There is no bias in the floating contact 102.

Note that the substrate terminal 5 in this example is at the same potential as the source terminal 8, that is an electrical connection might exist between the two either at package level or possibly circuit level. This is commonly the case in discrete GaN-on-Si or GaN-on-SiC devices. It might however not be the case in GaN-on-Sapphire case or for example, a device on the high side of a monolithically integrated GaN-on-Si half bridge.

When the drain terminal 9 is positively biased with respect to the source terminal 8, a current flows from the drain terminal 9 through the portion of the 2DEG that connects the drain terminal 9 to the floating contact layer 102. This current is formed by a flow of electrons from the floating contact layer 102 to the drain terminal 9 as illustrated in FIG. 4B.

Figure 4B:
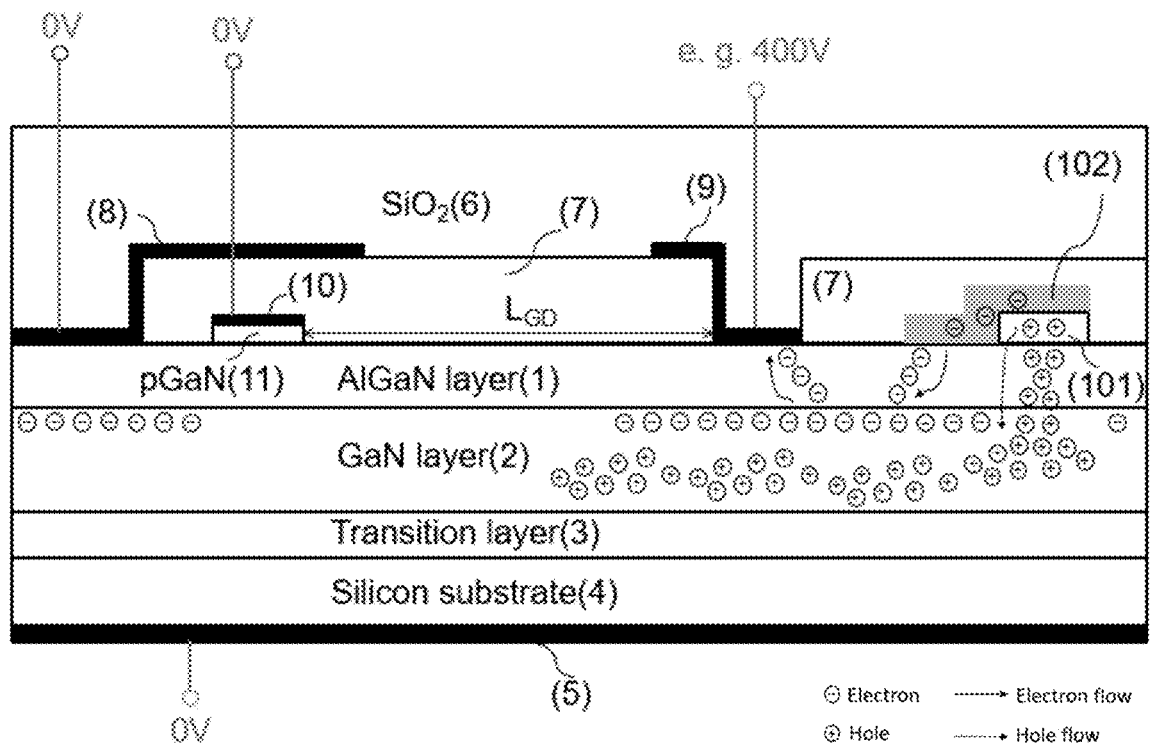
FIG. 4B illustrates a schematic representation of a cross section of the active area of the proposed disclosure according to one embodiment of the disclosure where the drain terminal is biased to a moderately high voltage (e.g. approximately 60% of nominal breakdown)

FIG. 4B illustrates a schematic representation of a cross section of the active area of the proposed disclosure according to one embodiment of the disclosure. In this configuration, the drain terminal 9 is biased to a moderately high voltage (e.g. approximately 60% of nominal breakdown). The floating contact layer 102 (i.e. metallization region that is not connected to any external electrodes) converts the electrons into holes which are then injected back into the III-Nitride region 2 from the p-injector region 101. In this example, the 2DEG could only be formed of electrons while the p+ injector is only a source of holes. The metal (on the floating contact layer) can provide both electrons and holes and converts the electron current from the 2DEG into a hole current in the p-injector region. This injection is particularly advantageous during the off-state stress or during the transient while the drain voltage raises.

Figure 4C:
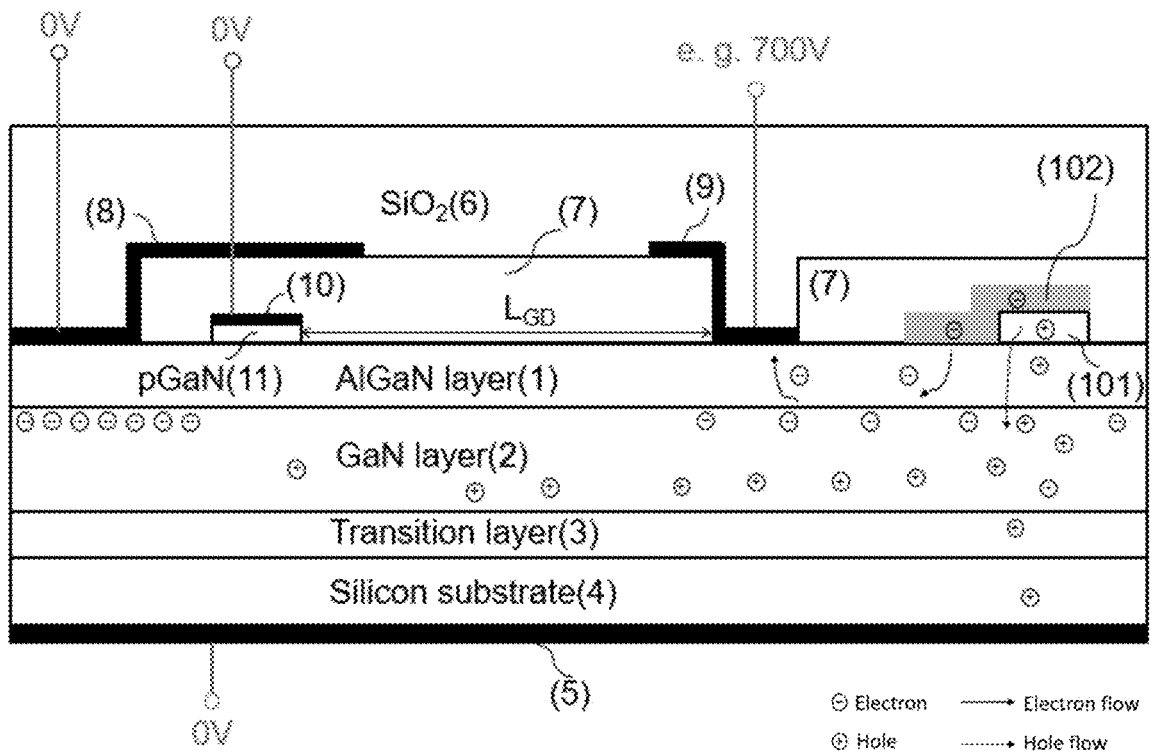
FIG. 4C illustrates a schematic representation of a cross section of the active area of the proposed disclosure according to one embodiment of the disclosure where the drain terminal is biased to a high voltage (e.g. above nominal breakdown)

However, at very high gate voltages, the 2DEG portion between the drain terminal 9 to the floating contact 102 gets depleted as illustrated in FIG. 4C. FIG. 4C illustrates a schematic representation of a cross section of the active area of the proposed disclosure according to one embodiment of the disclosure, where the drain terminal is biased to a high voltage (e.g. above nominal breakdown). As a result, the current made of electrons no longer flows into the floating contact layer 102 to be converted into holes and re-injected as leakage into the structure. The outcome in this embodiment is therefore a lower leakage current at high voltages than in the case where the p-injector 101 is hardwired to a hole injector electrode (e.g., drain 9).

Hole injection can happen also in the on-state, as the drain terminal 9 is at slightly higher potential than the source 8. This injection is generally limited as the potential difference between the terminals is significantly smaller than in the off-state. This on-state hole injection may however be significant in the scenario where trapped electrons, and therefore a region of negative charge 120, persist in the GaN buffer 2 after a period of off-state bias. This is illustrated in FIG. 4D.

Figure 4D:
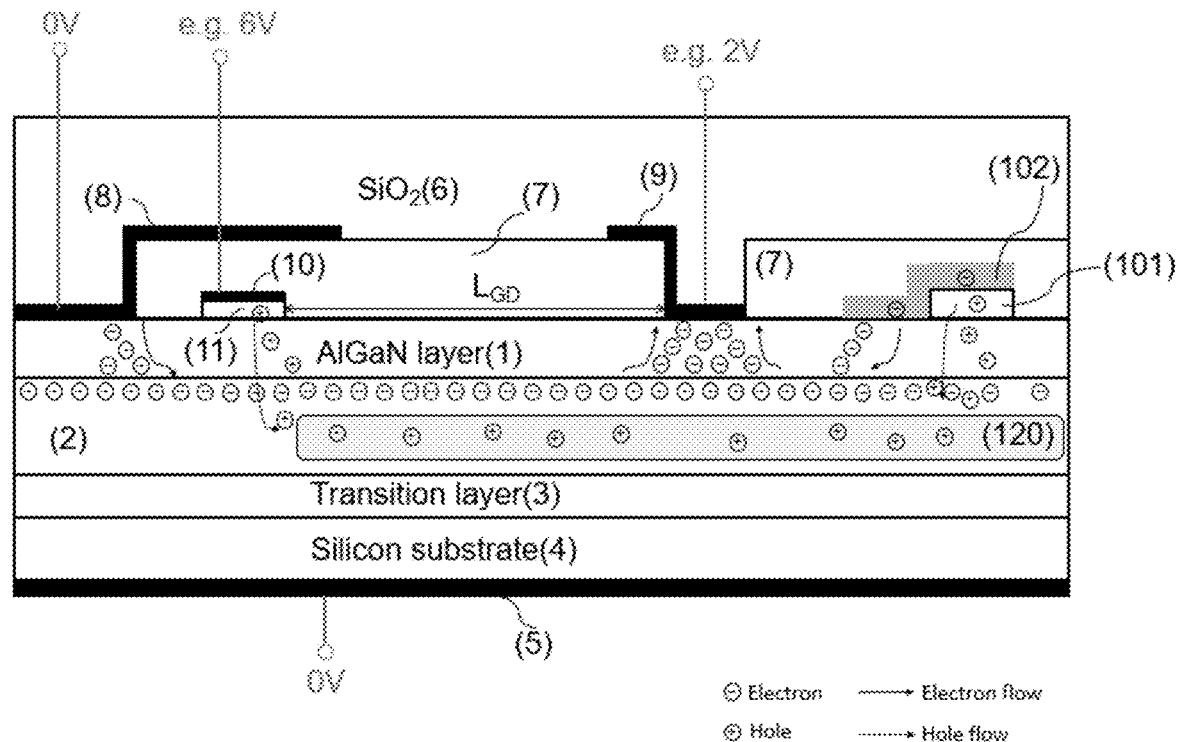
FIG. 4D illustrates a schematic representation of a cross section of the active area of the proposed disclosure according to one embodiment of the disclosure where the gate and drain terminal are biased to a low positive voltage i.e. the device is in the on-state condition.

FIG. 4D illustrates a schematic representation of a cross section of the active area of the proposed disclosure according to one embodiment. The gate 10 and drain terminal 9 are biased to a low positive voltage i.e. the device is in the on-state condition. In addition, some level of hole injection generally occurs from the pGaN region 11 beneath the gate electrode 10 as also illustrated in FIG. 4D.

Figure 5A:
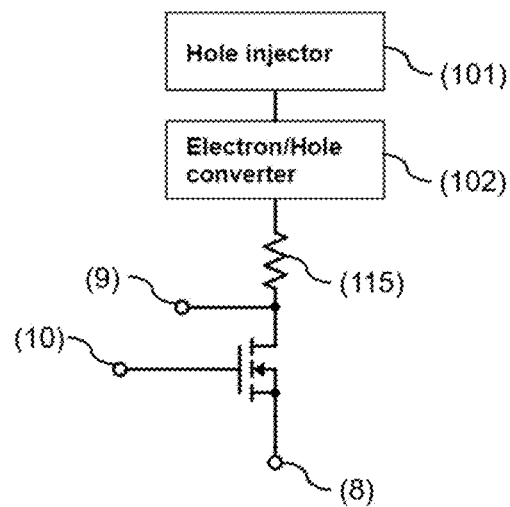
FIG. 5A illustrates a circuit schematic representation of the proposed disclosure according to one embodiment of the disclosure where all electrodes are at zero bias.

The good electrical connection 115 via the 2DEG between the drain terminal 9 and the floating contact 102 at zero bias (or moderate levels of off-state bias) is shown clearly in FIG. 5A which illustrates a circuit schematic representation of the proposed disclosure where all electrodes are at zero bias.

Figure 5B:
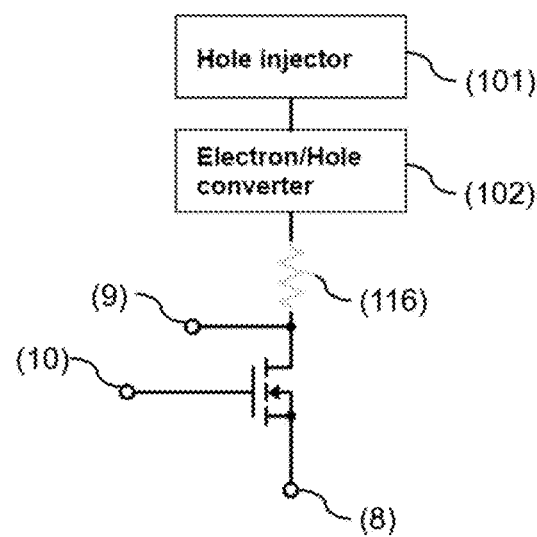
FIG. 5B illustrates a circuit schematic representation of the proposed disclosure according to one embodiment of the disclosure where the drain terminal is biased to a high voltage (e.g. above nominal breakdown)

The weakening or non-existent electrical connection 116 via the 2DEG between the drain terminal 9 and the floating contact 102 at high off-state bias is clearly shown in FIG. 5B. This illustrates a circuit schematic representation of the proposed disclosure where the drain terminal is biased to a high voltage (e.g. above nominal breakdown).

Figure 6A:
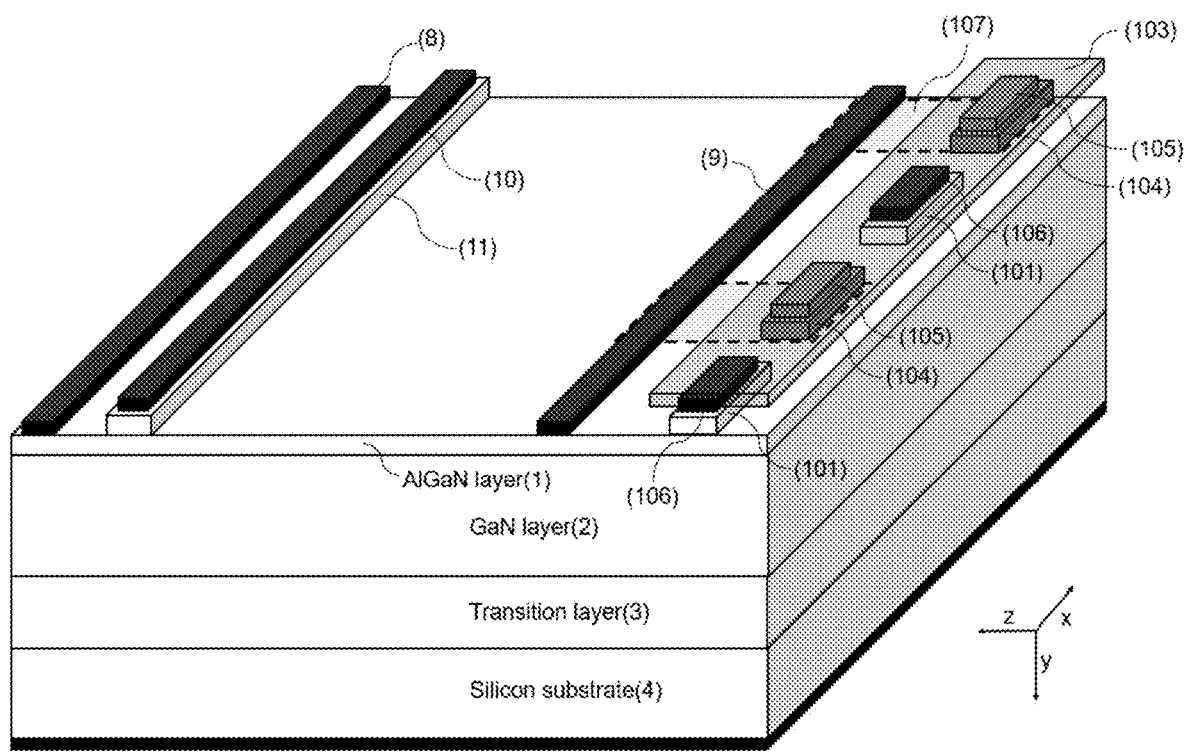
FIG. 6A illustrates a three-dimensional schematic representation of a section of the active area of the proposed disclosure where at least one p-injector region is placed outside the drift region.

FIG. 6A illustrates a three-dimensional schematic representation of a section of the active area of the proposed disclosure where again at least one p-injector region 101 is placed outside the drift region. In this embodiment, the floating contact 104 and p-injector region 101 are formed as islands of such structures in the third-dimension. Metal via 105 and floating metal interconnect 103 are used to connect the floating contact 104 to the p-injector region 101. A contact 106, which could be a different metallization from contact 104, is placed on the p-injector. In this diagram, there is a 2DEG connection 107 at zero bias between drain electrode 9 and contact 104. In this diagram, the floating contact layer is formed from the metal contacts 103, 104, 105 and 106.

Figure 6B:
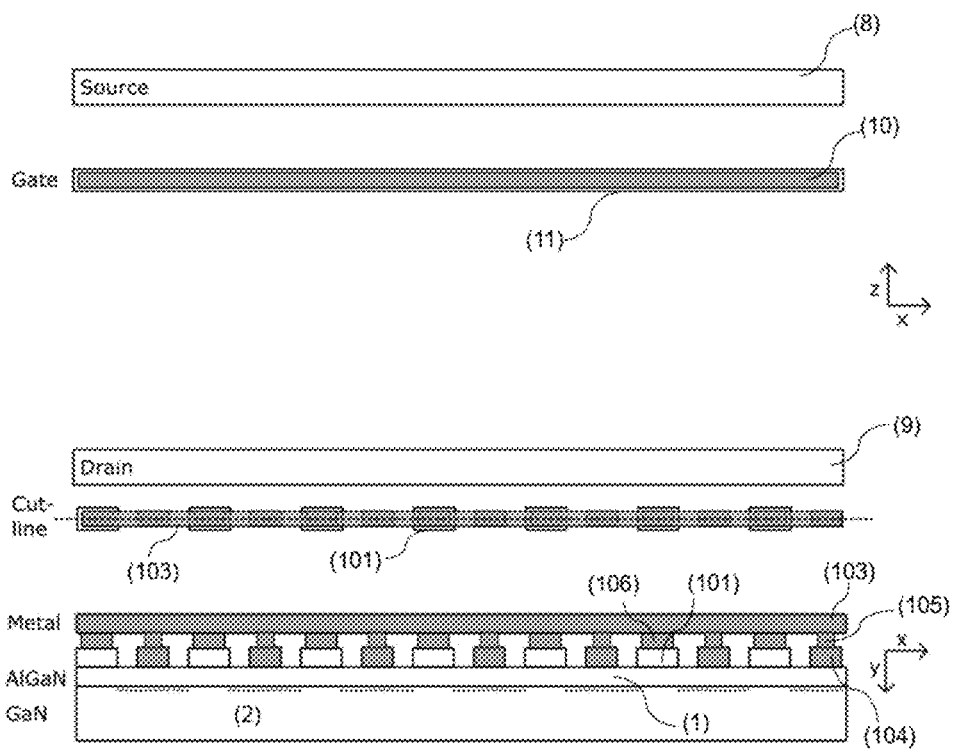
FIG. 6B shows a top view of the same section of the active area of the proposed disclosure (x, z axis).

FIG. 6B shows a top view of the same section of the active area of the proposed disclosure (x, z axis). FIG. 6B shows a schematic representation of a cross section of the active area of the proposed disclosure (x, y axis) along the cutline shown in the top view.

FIG. 5C shows a top view and cross section of a variant of the structure in FIG. 6B where the distance of the floating contact island 104 and the p-injector region 101 from the drain electrode 9 is not equal. Advantageously, a reduced distance between p-injector 101 and drain electrode 9 may increase the effectiveness of the mechanism of hole injection. An increased distance between floating contact 104 may lead to more effective depletion of the 2DEG at high off-state bias between the drain electrode 9 and the floating contact 104.

Figure 7:
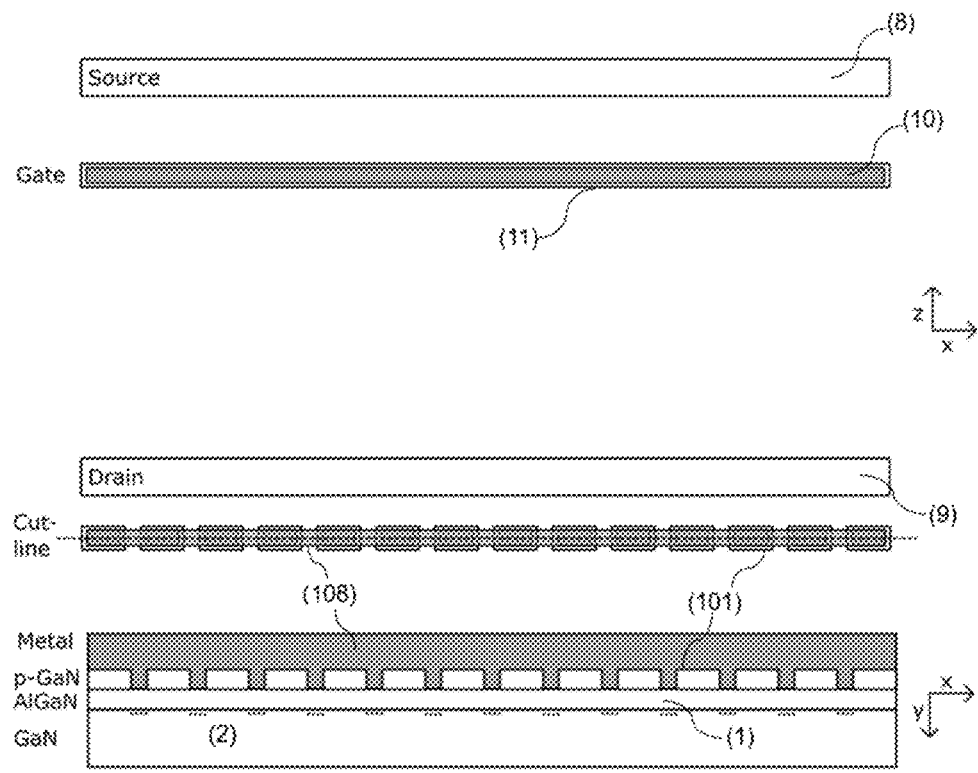
FIG. 7 shows a top view (x, z axis) of a section of the active area of the proposed disclosure where at least one p-injector region is placed outside the drift region.

FIG. 7 shows a top view (x, z axis) of a section of the active area of the proposed disclosure where at least one p-injector region 101 is placed outside the drift region.

Figure 6C:
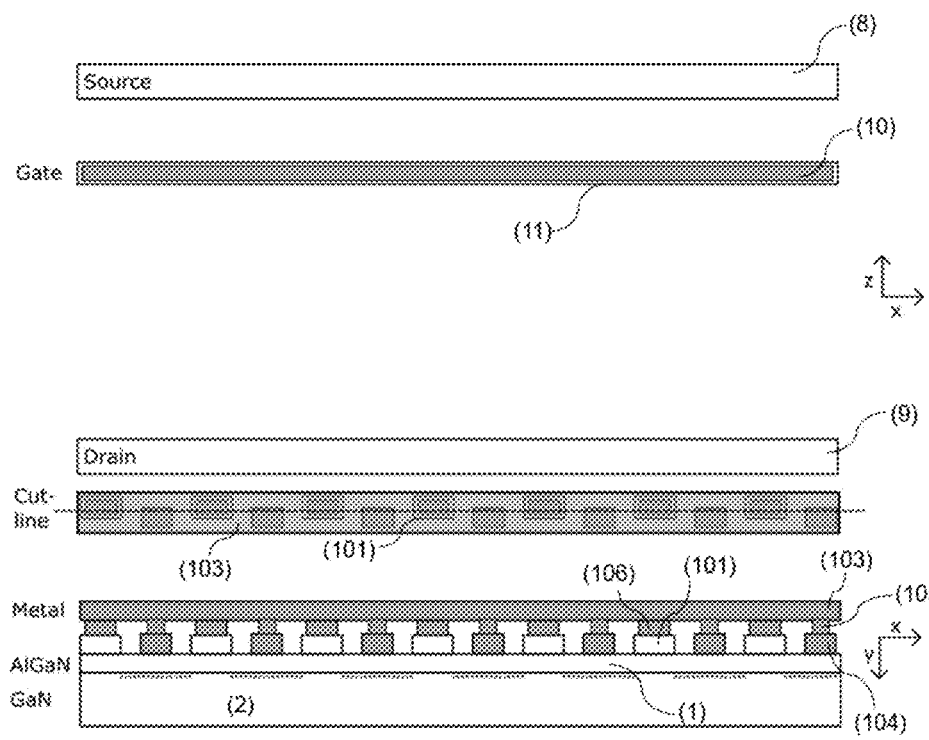
FIG. 6C shows a top view and cross section of a variant of the structure in FIG. 6B.

FIG. 7 shows a schematic representation of a cross section of the active area of the proposed disclosure (x, y axis) along the cutline shown in the top view. Similar to FIG. 6, FIG. 7 also contains islands of p-injector regions 101 in the third dimension however a continuous metallisation layer 108. A single process step may be used to form both of the floating contact and the contact on the p-injector islands 101.

Figure 8:
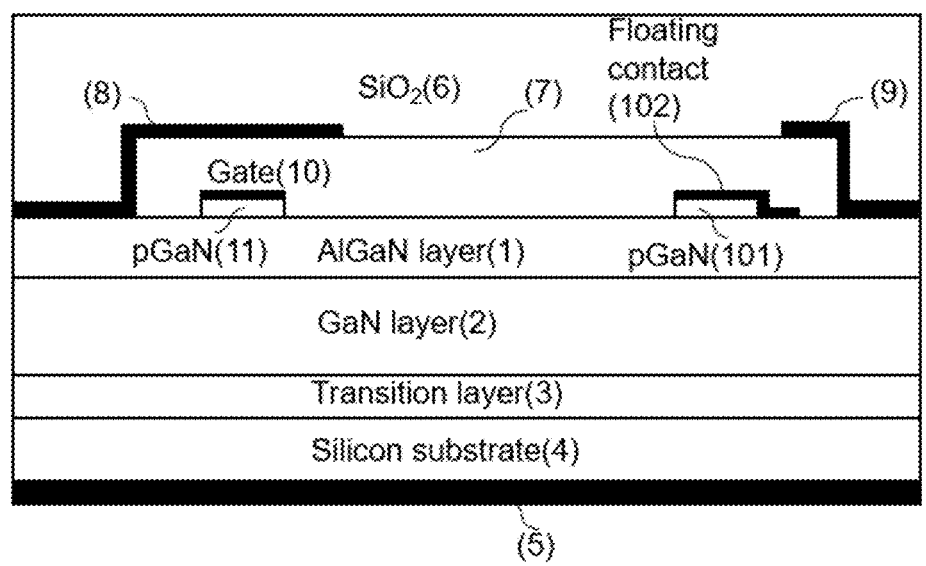
FIG. 8 illustrates a schematic representation of a cross section of the active area of the proposed disclosure according to a further embodiment of the disclosure where the p-injector region is placed inside the drift region.

FIG. 8 illustrates a schematic representation of a cross section of the active area of the proposed disclosure according to a further embodiment of the disclosure where the p-injector region 101 is placed inside the drift region. Placing the p-injector 101 and the floating contact layer 102 laterally between the source terminal 8 and the drain terminal 9 and closer to the source terminal 8 would allow the hole injection to become stronger at lower potentials applied to the drain 9. Several such p-injector/floating contact structures can be placed laterally between the source terminal 8 and drain terminal 9. Placing one or more of such p-injector/floating contact structures inside the drift region leads to a weakening of the 2DEG beneath the p-injector regions, which may statically increase the on-state resistance of the device. Advantageously, placing islands of such structures in the third-dimension reduces this effect. Such an embodiment is illustrated in FIG. 9.

Figure 9A:
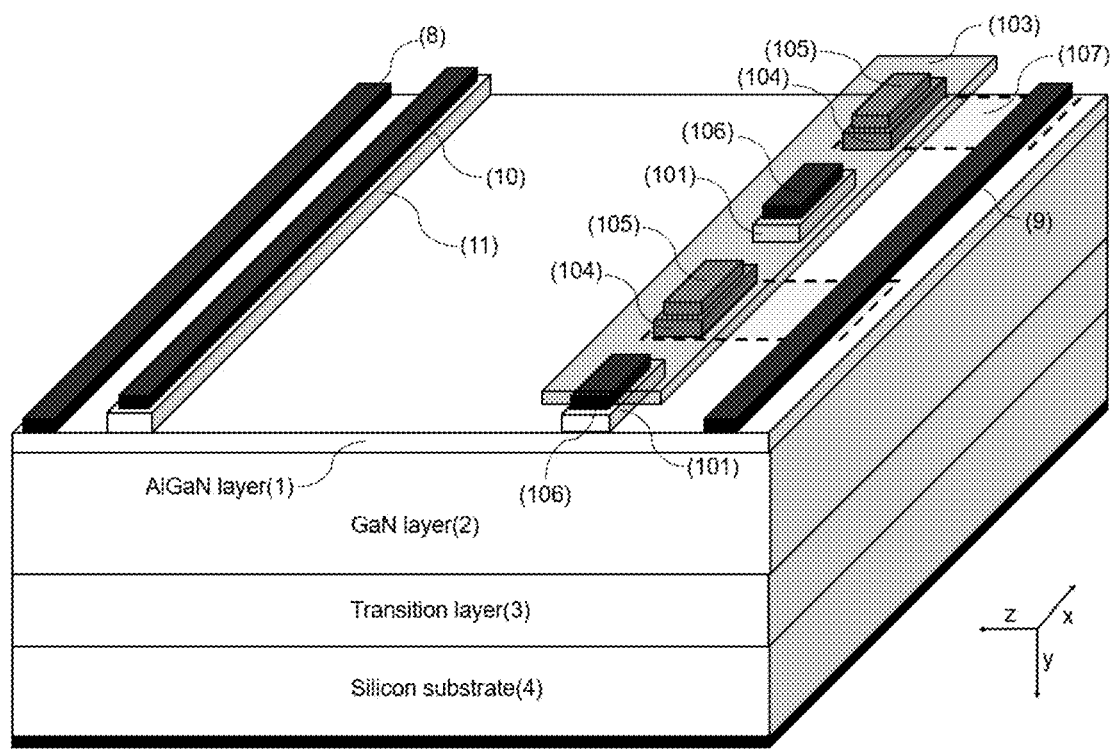
FIG. 9A illustrates a three-dimensional schematic representation of a section of the active area of the proposed disclosure where at least one p-injector region is placed inside the drift region.

FIG. 9A illustrates a three-dimensional schematic representation of a section of the active area of the proposed disclosure where at least one p-injector region 101 is placed inside the drift region. In this embodiment, a floating contact 104 is shown making a good ohmic connection 107 to the 2DEG at zero bias. Metal via 105 and floating metal interconnect 103 are used to connect the floating contact 104 to the p-injector region 101. A contact 106, which could be a different metallization from contact 104, is placed on the p-injector. In this diagram, the floating contact layer is formed from the metal contacts 103, 104, 105 and 106.

Figure 9B:
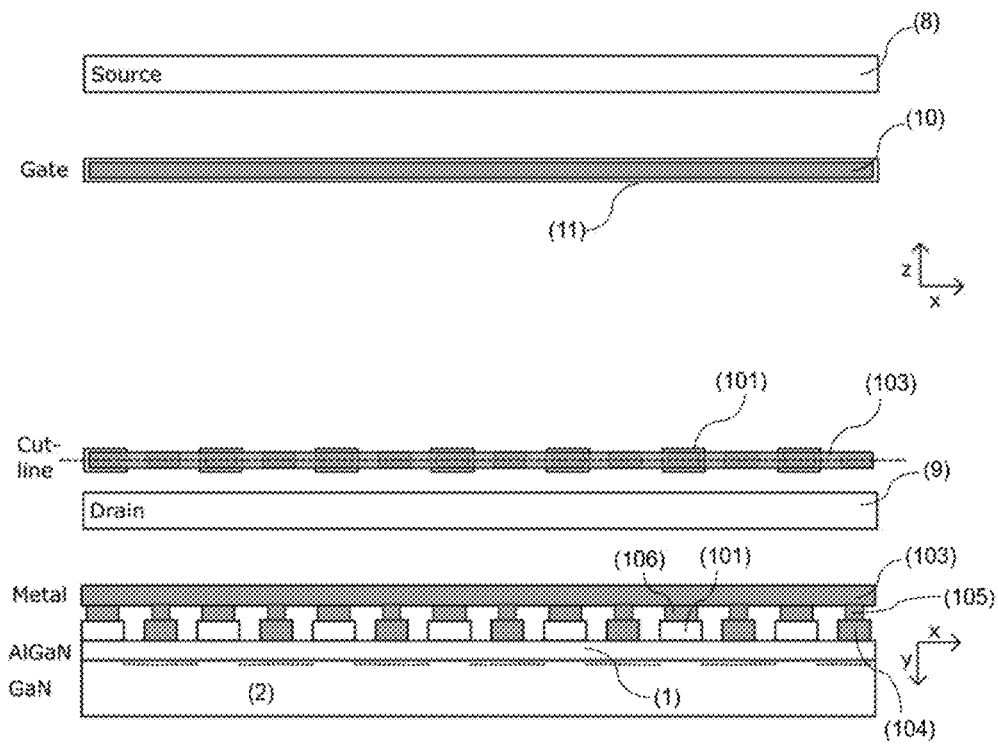
FIG. 9B shows a top view of the same section of the active area of the proposed disclosure (x, z axis).

FIG. 9B shows a top view of the same section of the active area of the proposed disclosure (x, z axis). FIG. 9B shows a schematic representation of a cross section of the active area of the proposed disclosure (x, y axis) along the cutline shown in the top view.

Figure 10:
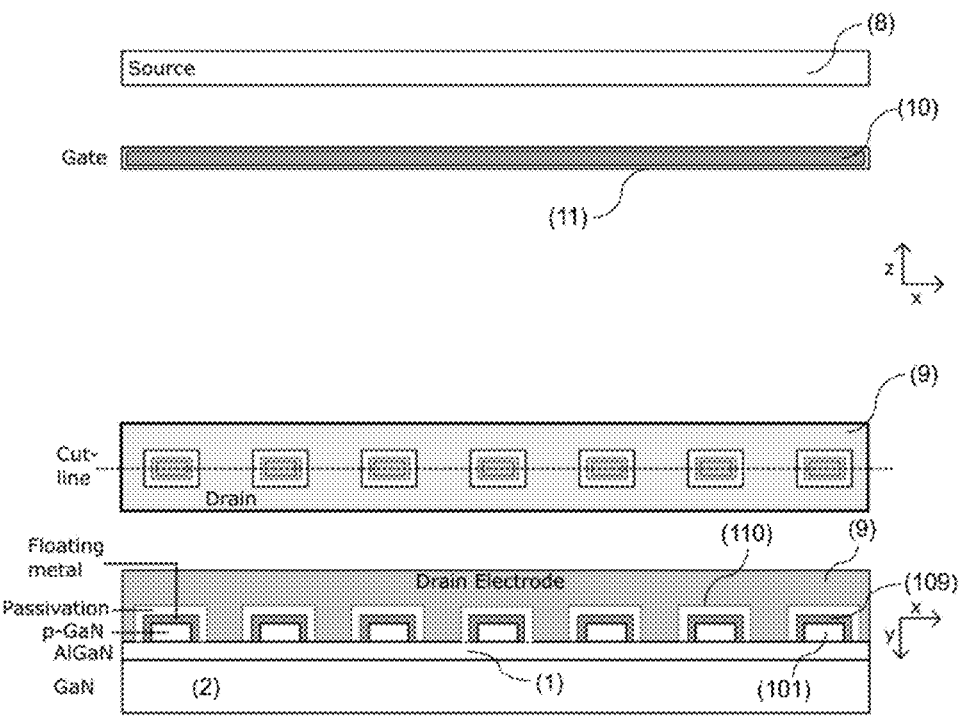
FIG. 10 shows a top view (x, z axis) of a section of the active area of the proposed disclosure where at least one p-injector region is placed beneath the drain electrode finger metallization.

FIG. 10 shows a top view (x, z axis) of a section of the active area of the proposed disclosure where at least one p-injector region is placed beneath the drain electrode finger metallization. FIG. 10 shows a schematic representation of a cross section of the active area of the proposed disclosure (x, y axis) along the cutline shown in the top view. In this embodiment the metallisation of the drain electrode 9 covers the floating contact 109 and the p-injector region 101 which are again implemented as islands in the third dimension. The drain electrode 9 is separated from these islands electrically using a passivation layer 110.

Figure 11:
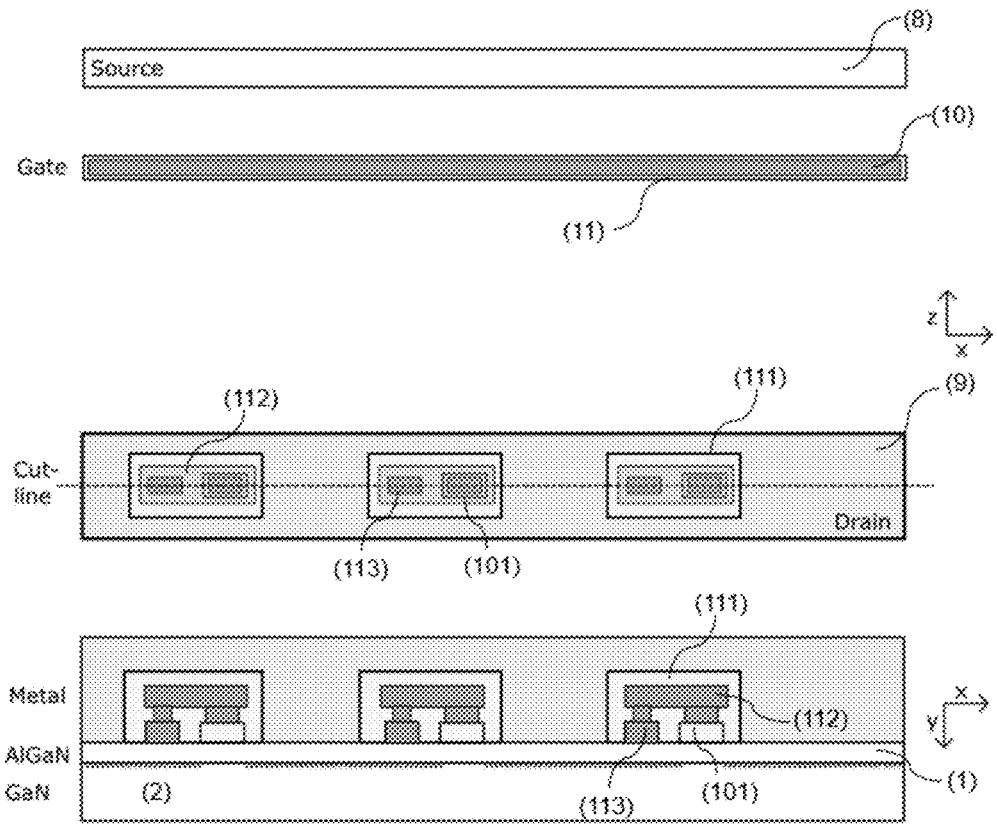
FIG. 11 shows a top view (x, z axis) of a section of the active area of the proposed disclosure where at least one p-injector region is placed beneath the drain electrode finger metallization.

FIG. 11 shows a top view (x, z axis) of a section of the active area of the proposed disclosure where at least one p-injector region is placed beneath the drain electrode finger metallization. FIG. 11 shows a schematic representation of a cross section of the active area of the proposed disclosure (x, y axis) along the cutline shown in the top view. In this embodiment, similar to the embodiment of FIG. 10, islands of floating contacts 113 and p-injector region 101 are placed under the drain electrode 9 and separated electrically from it using passivation layer 111. The floating contact 113 and p-injector region 101 are connected electrically using metallisation layer 112. In this diagram, the floating contact layer is formed from the metal contacts 112, 113.

Figure 12:
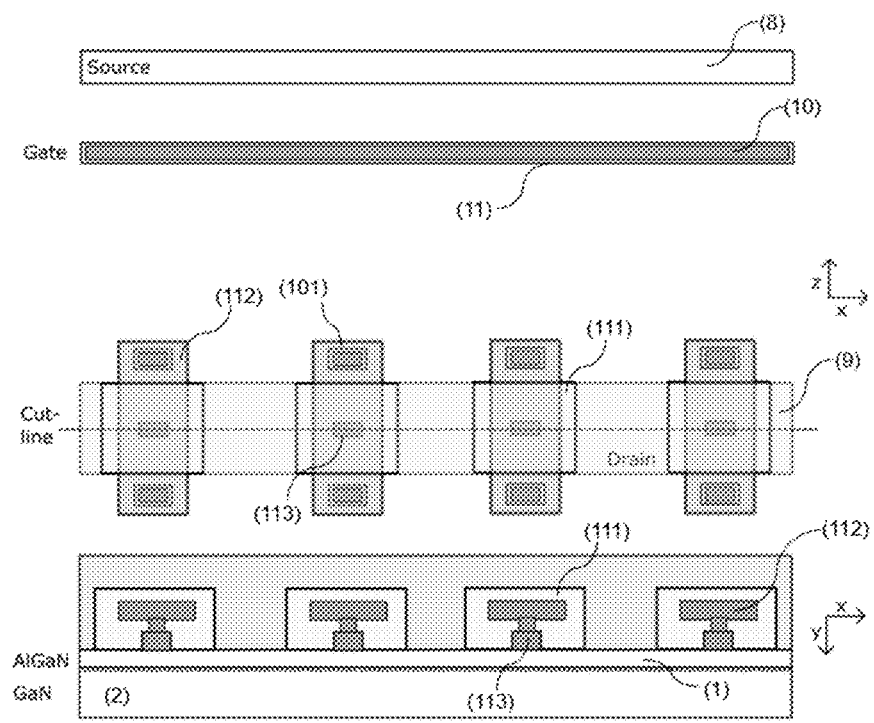
FIG. 12 shows a top view (x, z axis) of a section of the active area of the proposed disclosure where at least one p-injector region is placed inside the drift region and at least one floating contact is placed beneath the drain electrode finger metallization.

FIG. 12 shows a top view (x, z axis) of a section of the active area of the proposed disclosure where at least one p-injector region is placed inside the drift region and at least one floating contact is placed beneath the drain electrode finger metallization. FIG. 12 shows a schematic representation of a cross section of the active area of the proposed disclosure (x, y axis) along the cutline shown in the top view. In this embodiment, floating contact 113 is placed under the drain electrode 9 whereas the p-injector region 101 is placed as islands inside the drift region. Floating contact 113 and p-injector 101 are connected electrically using metallisation layer 112 and separated from the drain electrode using passivation layer 111. Advantageously, placing the p-injector region inside the drift region may be more effective in reducing or eliminating the phenomenon of dynamic Ron degradation. In this diagram, the floating contact layer is formed from the metal contacts 112, 113.

Figure 13:
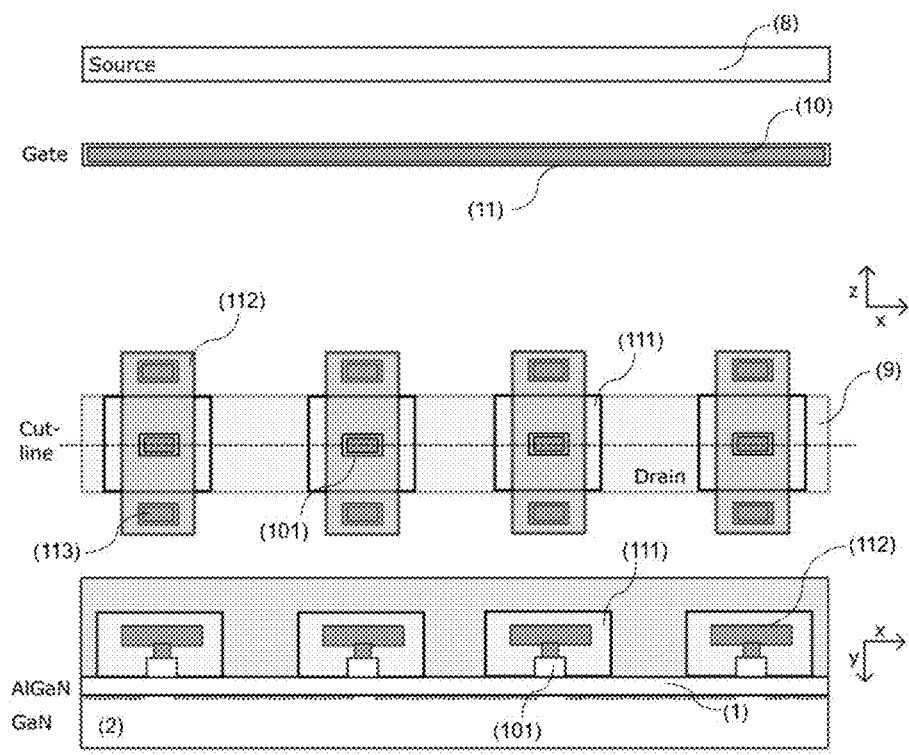
FIG. 13 shows a top view (x, z axis) of a section of the active area of the proposed disclosure where at least one floating contact is placed inside the drift region and at least one p-injector region is placed beneath the drain electrode finger metallization.

FIG. 13 shows a top view (x, z axis) of a section of the active area of the proposed disclosure where at least one floating contact is placed inside the drift region and at least one p-injector region is placed beneath the drain electrode finger metallization. FIG. 13 shows a schematic representation of a cross section of the active area of the proposed disclosure (x, y axis) along the cutline shown in the top view. In this embodiment, p-injector region 101 is placed under the drain electrode 9 whereas the floating contact 113 is placed as islands inside the drift region. Floating contact 113 and p-injector 101 are connected electrically using metallisation layer 112 and separated from the drain electrode using passivation layer 111. Advantageously, placing the floating contact inside the drift region may lead to achieving a depletion of the 2DEG located between the drain contact 9 and the floating contact 113 at a lower off-state bias voltage in comparison to an embodiment where the floating contact is outside the drift region. This can limit the hole injection current at lower off-state bias if it is found to contribute significantly to the device off-state leakage current.

Figure 14:
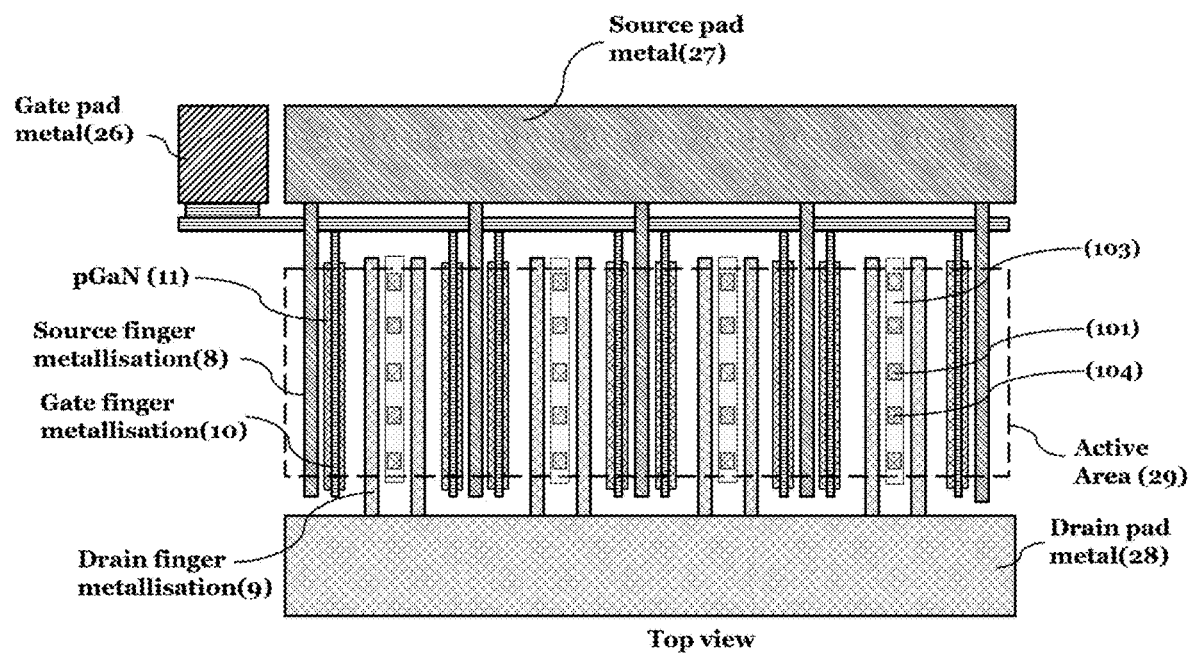
FIG. 14 shows a top view (x, z axis) of an interdigitated device layout embodiment of the proposed disclosure.

FIG. 14 shows a top view (x, z axis) of an interdigitated device layout embodiment of the proposed disclosure. In this embodiment, the floating contact 104, the p-injector region 101 and electrical connection between them, metallisation layer 103, are all placed outside of the drift region. All of the previously described embodiments can be implemented using variations of an interdigitated layout similar to the exemplary layout shown in FIG. 14.

Figure 15A:
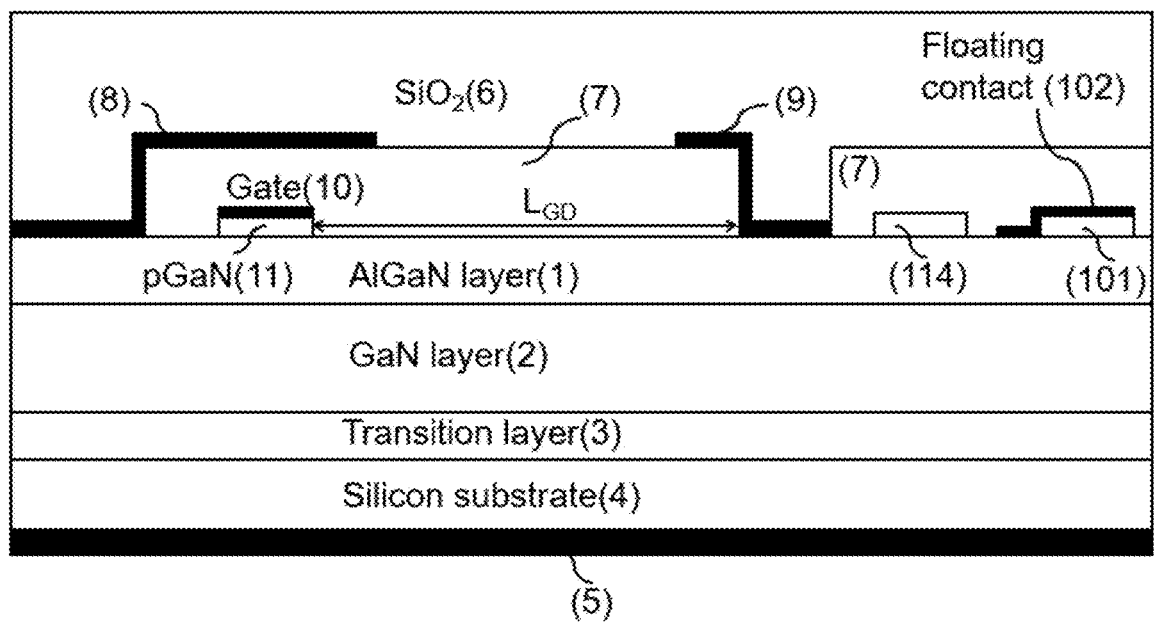
FIG. 15A illustrates a schematic representation of a cross section of the active area of the proposed disclosure according to one embodiment of the disclosure where the p-injector region is placed outside the drift region.

FIG. 15A illustrates a schematic representation of a cross section of the active area of the proposed disclosure according to one embodiment of the disclosure where the p-injector region is placed outside the drift region. In this embodiment, a second floating p-type region 114 could be inserted laterally between the drain 9 and the contact of the floating contact metal 102. This second floating region 114 has only the role to weaken the charge of the portion of the 2DEG between the drain metal 9 and the actual contact of the floating contact layer 102. Advantageously, in operation this facilitates the depletion of this portion of the 2DEG when a very high voltage is present on the drain terminal 9. The p-type region 114 may be a different from (for example in layer thickness or doping concentration) or the same as p-type region 11 and p-type region 101 as the features of each region may be optimized accordingly.

Figure 15B:
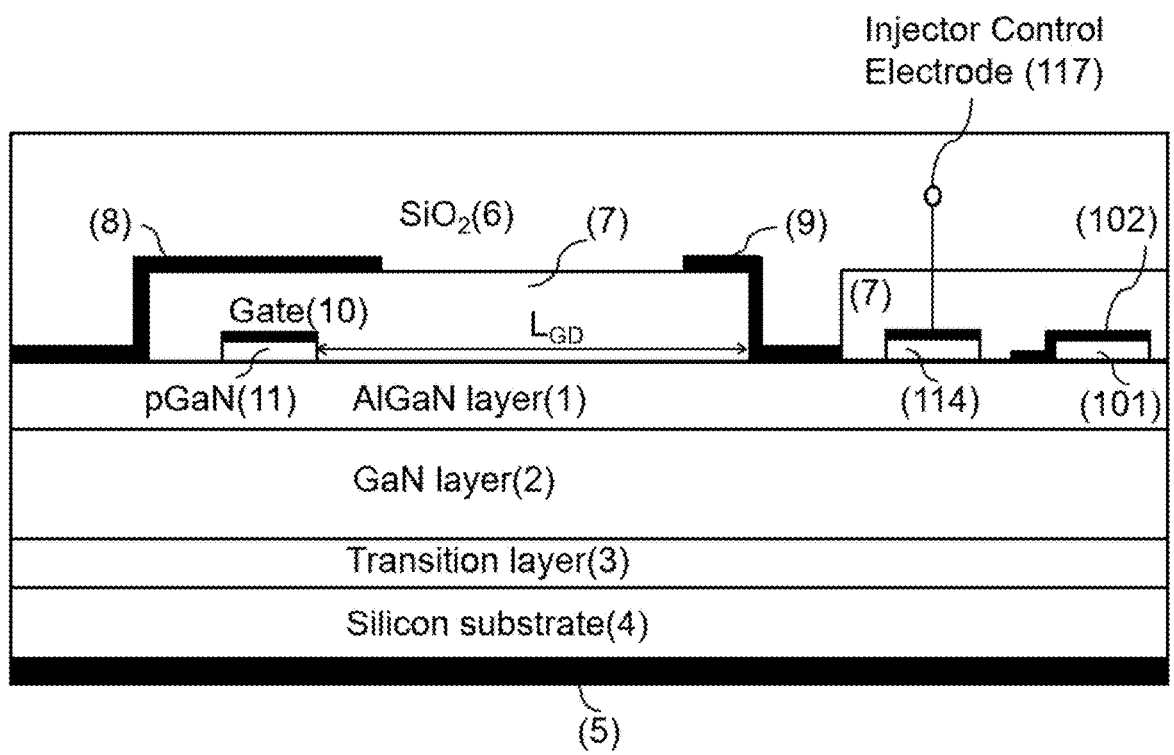
FIG. 15B illustrates a schematic representation of a cross section of the active area of the proposed disclosure according to one embodiment of the disclosure where the p-injector region is placed outside the drift region.

FIG. 15B illustrates a schematic representation of a cross section of the active area of the proposed disclosure similar to FIG. 15A where the p-type region 114 is not floating but is connected to an external injector control electrode 117. The voltage bias of electrode 117 can be used to modulate the carrier concentration in the 2DEG beneath it and therefore control the hole injection current from the p-injector region 101. The potential and the current through the electrode 117 could be provided by an external circuit (which could be part of the driver) which could control its operation as to compensate for the dynamic Ron. The control sequence could be pre-determined (for example being on at certain drain voltages in the off-state) or could have a feedback from a circuit estimating the Ron in certain conditions and determine if Ron degrades and as a result injecting current into the hole injector electrode.

Figure 16A:
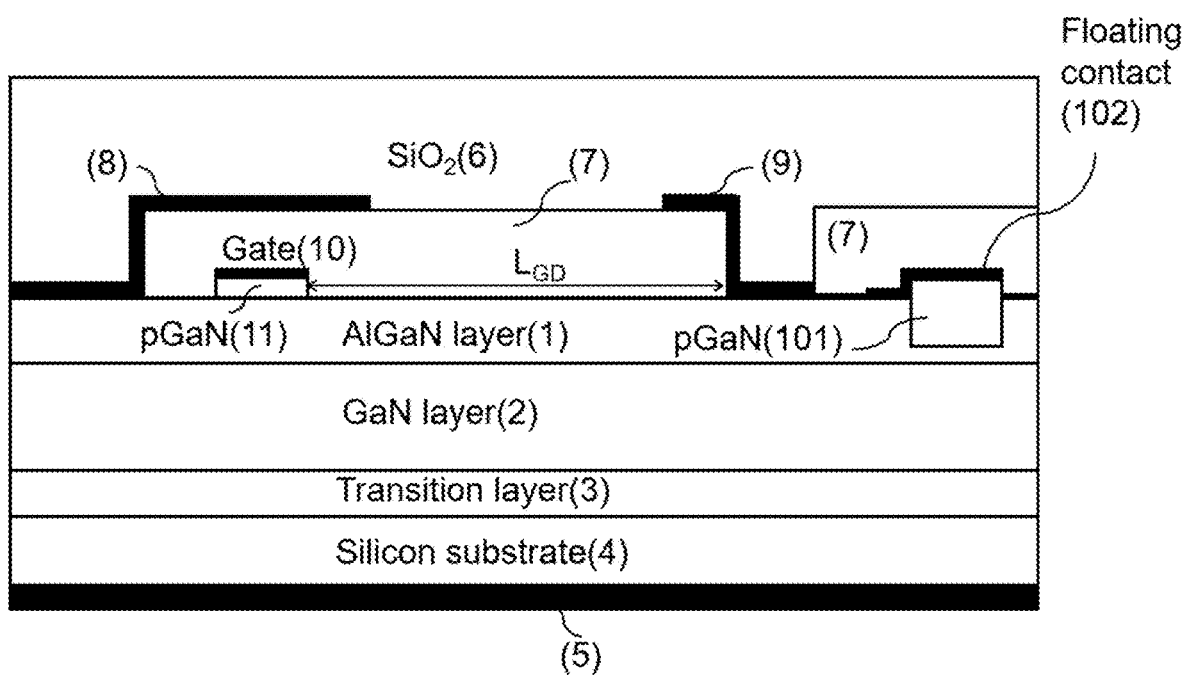
FIG. 16A illustrates a schematic representation of a cross section of the active area of the proposed disclosure according to one embodiment of the disclosure where the p-injector region is placed outside the drift region.

FIG. 16A illustrates a schematic representation of a cross section of the active area of the proposed disclosure according to one embodiment of the disclosure where the p-injector region 101 is placed outside the drift region. In this embodiment, a recess is provided for the p-injector, so that the p-injector 101 is closer to the 2DEG to facilitate easier injection of holes.

Figure 16B:
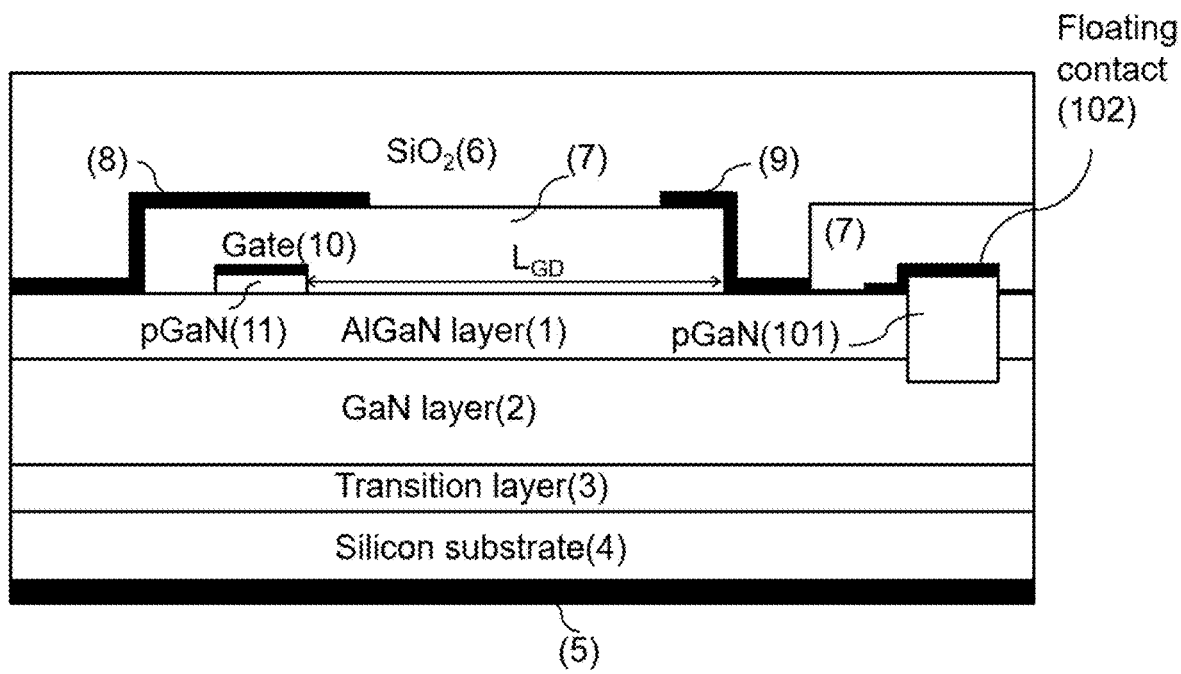
FIG. 16B illustrates a schematic representation of a cross section of the active area of the proposed disclosure according to one embodiment of the disclosure where the p-injector region is placed outside the drift region.

FIG. 16B illustrates a schematic representation of a cross section of the active area of the proposed disclosure according to one embodiment of the disclosure where the p-injector region 101 is placed outside the drift region. In this embodiment, a recess is provided for the p-injector, so that the p-injector 101 is below the 2DEG to facilitate easier injection of holes.

Figure 17:
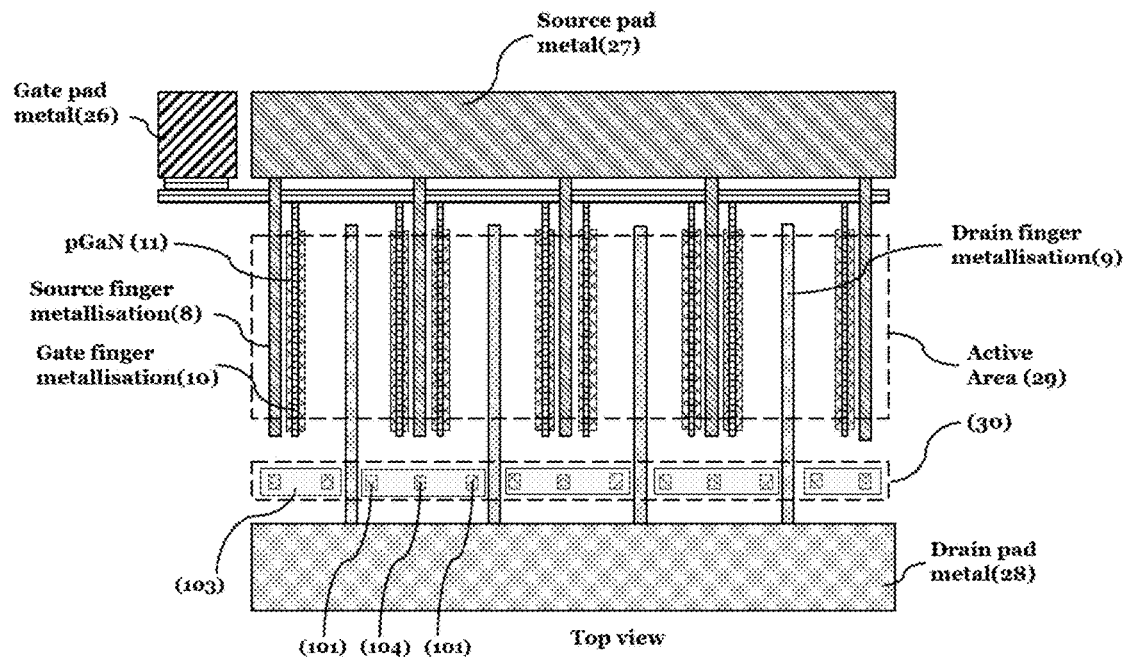
FIG. 17 shows a top view (x, z axis) of an interdigitated device layout embodiment of the proposed disclosure.

FIG. 17 shows a top view (x, z axis) of an interdigitated device layout embodiment of the proposed disclosure. In this embodiment, a p-injector region 101 is placed outside the main active area of the device 29, inside its own isolated active area 30. In this case, the floating contact layer 104 and the 2DEG portion between the drain terminal and the contact of the floating contact metal are placed outside the main active area 29 in another isolated active area of the device 30. Such isolated area could be placed at the edge of the device or for example in the vicinity of drain pad 28 as shown.

Figure 18:
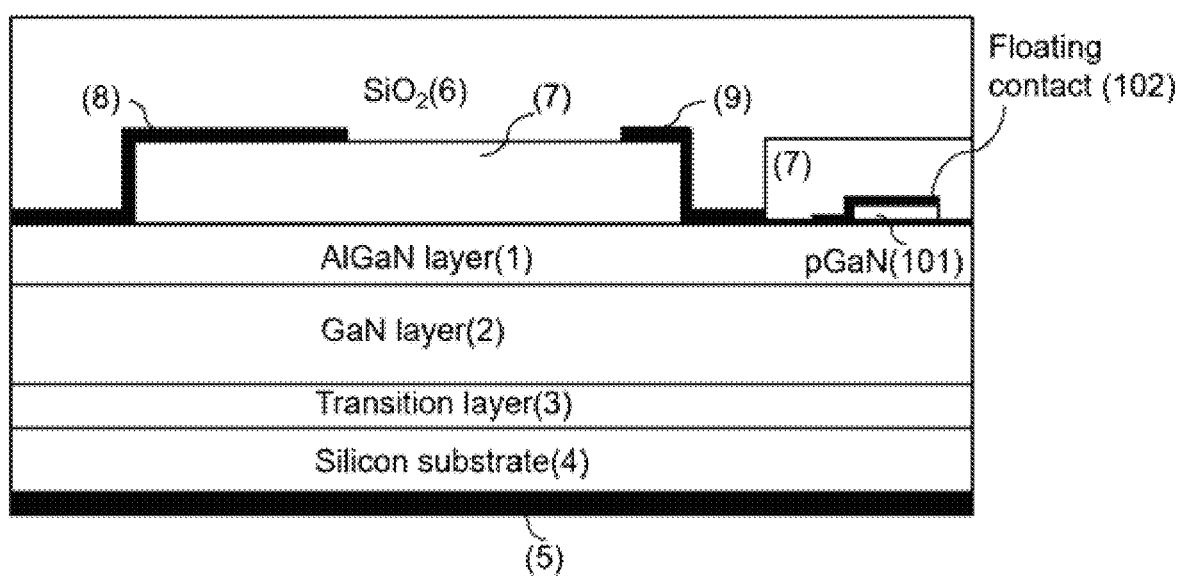
FIG. 18 illustrates a schematic representation of a cross section diode according to the second aspect of the invention, where the p-injector region is placed outside the drift region.

FIG. 18 shows a schematic cross section of a diode according to a second aspect of the invention. The feature of this figure are broadly similar to those of FIG. 3, but do not include the fourth region 11 or gate control terminal 10. In this example, electrode 8 would be a Schottky contact in order to produce a Schottky diode. Advantageously, the inclusion of p-injector 101 reduce or minimise the on-state loss of conductivity when the diode is forward-biased, especially when the diode has been previously exposed to a high voltage stress during reverse-bias. The above described alternative embodiments of the p-injector, in particular but not limited to those described with reference to FIGS. 5-11, 13 and 14, may also be utilised in conjunction with a diode according to this aspect of the invention.

Alternatively, a rectifier where the gate and source terminal of FIG. 3 are electrically connected (rather than a Schottky anode as in FIG. 18) can be designed.

Generally speaking, in this disclosure, the first conductivity type refers to p-type conductivity and the second conductivity type generally refers to the n-type conductivity. However, it will be understood that the conductivity type can be readily reversed. The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

LIST OF REFERENCE NUMERALS

1—AlGaN layer
2—GaN layer

3—Transition layer
4—Silicon substrate
5—Substrate electrode
6—Silicon Dioxide passivation
7—Surface passivation
8—Source electrode
9—Drain electrode
10—Gate electrode
11—pGaN layer
26—gate pad metal
27—source pad metal
28—drain pad metal
29—active area
30—second active area
80—external drive
90—additional electrode
101—p-injector region/pGaN hole injection layer
102—floating contact (electron/hole converter)
103—floating metal interconnect
104—ohmic contact
105—metal via
106—metal contact
107—2DEG connection at zero bias between drain electrode 9 and ohmic contact 104
108—floating contact/metallisation track (electron/hole converter)
109—floating contact (electron/hole converter)
110—passivation/inter-metal dielectric
111—passivation/inter-metal dielectric
112—floating metal interconnect
113—ohmic contact
114—additional p-region
115—Strong 2DEG electrical connection
116—Weak 2DEG electrical connection
117—Injector Control Electrode
120—region of trapped negative charge

The invention claimed is:

1. A III-nitride semiconductor based heterojunction device, comprising:
a substrate;
a III-nitride semiconductor region located over the substrate, wherein the III-nitride semiconductor region comprises a heterojunction comprising at least one two-dimensional carrier gas;
a first terminal operatively connected to the III-nitride semiconductor region;
a second terminal operatively connected to the III-nitride semiconductor region and laterally spaced from the first terminal;
a gate structure located above the III-nitride semiconductor region and laterally spaced between the first and second terminals, the gate structure being a first conductivity type;
a control gate terminal operatively connected to the gate structure, wherein a potential applied to the control gate terminal modulates and controls a current flow through the two-dimensional carrier gas between the first and second terminals, the at least one two-dimensional carrier gas being a second conductivity type;
at least one injector of carriers of the first conductivity type laterally spaced away from the second terminal; and
a floating contact layer located over the two dimensional carrier gas and operatively connected to, and in physical contact with, both the at least one injector and the III-nitride semiconductor region, wherein the floating contact layer is laterally spaced away from the second terminal.

2. A III-nitride semiconductor based heterojunction device according to claim 1, wherein a lateral spacing between the at least one injector and the second terminal is less than a lateral spacing between the at least one injector and the first terminal.

3. A III-nitride semiconductor based heterojunction device according to claim 1, wherein at least one portion of the at least one two-dimensional carrier gas is present between the second terminal and the floating contact layer, wherein the at least one portion of the at least one two-dimensional carrier gas is configured to provide a conductive path made of carriers of the second conductivity type between the second terminal and the floating contact layer.

4. A III-nitride semiconductor based heterojunction device according to claim 3, wherein, in operation, the at least one portion of the at least one two-dimensional carrier gas partially or completely depletes upon application of a potential on the second terminal greater than a potential on the first terminal.

5. A III-nitride semiconductor based heterojunction device according to claim 1, wherein:
one or more of the at least one two-dimensional carrier gas is a two dimensional electron gas (2DEG); and/or
the first terminal is a source terminal; and/or
the second terminal is a drain terminal; and/or
each of the at least one injector of carriers of the first conductivity type is a p-injector of holes.

6. A III-nitride semiconductor based heterojunction device according to claim 5, wherein the floating contact layer is configured to convert electrons to holes so as to act as an electron to hole converter.

7. A III-nitride semiconductor based heterojunction device according to claim 5, wherein a current of the holes injected by the at least one p-injector is substantially equal to a current of electrons between the drain terminal and the floating contact layer via a portion of the one or more 2DEG.

8. A III-nitride semiconductor based heterojunction device according to claim 1, wherein each of the floating contact layer and the first and second terminals are configured to be electrically connected to at least a portion of the at least one two-dimensional carrier gas.

9. A III-nitride semiconductor based heterojunction device according to claim 8, wherein the floating contact layer is either an ohmic contact or a Schottky contact with one or more of the at least one two-dimensional carrier gas and the at least one injector.

10. A III-nitride semiconductor based heterojunction device according claim 1, wherein the floating contact layer comprises at least one isolated metal layer that is not operatively connected to any electrodes or terminals.

11. A III-nitride semiconductor based heterojunction device according to claim 1, wherein, in use, an injection of carriers of the first conductivity type occurs when an off-state voltage is applied to the second terminal with respect to the first terminal or during a transient while the voltage of the second terminal rises.

12. A III-nitride semiconductor based heterojunction device according to claim 1, wherein an injection of carriers of the first conductivity type occurs during an on-state of the device.

13. A III-nitride semiconductor based heterojunction device according to claim 1, wherein at least one of the at least one injector and the operative connection of the floating contact layer to the III-nitride semiconductor region is laterally spaced between the first and second terminals.

14. A III-nitride semiconductor based heterojunction device according to claim 1, wherein at least one of the at least one injector and the operative connection of the floating contact layer to the III-nitride semiconductor region is laterally spaced outside of a region between the first and the second terminals.

15. A III-nitride semiconductor based heterojunction device according to claim 1, wherein the device includes a plurality of injector islands in a third dimension, wherein said plurality of injector islands are either (i) all connected to a single floating contact layer, or (ii) each connected to at least one of a plurality of single floating contact layers.

16. A III-nitride semiconductor based heterojunction device according to claim 1, wherein a second floating p-type region is laterally spaced between the second terminal and a location at which the floating contact layer contacts the III-nitride semiconductor region.

17. A III-nitride semiconductor based heterojunction device according to claim 1, wherein the first terminal and the gate control terminal are operatively connected.

18. A III-nitride semiconductor based heterojunction device according to claim 1, wherein a trench or a recess is provided for the metallization of one or more of the first and second terminals and the floating contact layer, such that a direct connection is established between the one or more of the first and second terminals and the floating contact layer and their respective portions of the at least one two-dimensional carrier gas.

19. A III-nitride semiconductor based heterojunction device according to claim 1, wherein the at least one injector is recessed below the surface of the III-nitride semiconductor region.

20. A III-nitride semiconductor based heterojunction device according to claim 1, wherein the at least one injector, the floating contact layer and a portion of the at least one two-dimensional carrier gas between a location at which the floating contact layer contacts to the III-nitride semiconductor region and the second terminal are in a second active area of the device, wherein the second active area of the device is isolated from a first active area of the device comprising the first and second terminals.

21. A III-nitride semiconductor based heterojunction device according to claim 1, wherein one or more of the at least one injector, the floating contact layer and a portion of the at least one two-dimensional carrier gas between a location at which the floating contact layer contacts to the III-nitride semiconductor region, and the second terminal, is located below a drain pad.

22. A III-nitride semiconductor based heterojunction device, comprising:
    a substrate;
    a III-nitride semiconductor region located over the substrate, wherein the III-nitride semiconductor region comprises a heterojunction comprising at least one two-dimensional carrier gas;
    a first terminal operatively connected to the III-nitride semiconductor region and forming a Schottky or an ohmic contact to the at least one two-dimensional carrier gas;
    a second terminal operatively connected to the III-nitride semiconductor region and laterally spaced from the first terminal, forming a Schottky or an ohmic contact to the at least one two-dimensional carrier gas;
    at least one injector of carriers of a first conductivity type laterally spaced away from the second terminal; and
    a floating contact layer located over the two dimensional carrier gas and operatively connected to, and in physical contact with, both the at least one injector and the III-nitride semiconductor region, wherein the two-dimensional carrier gas is of a second conductivity type.

23. A method of manufacturing a III-nitride semiconductor based heterojunction device having:
    a substrate;
    a III-nitride semiconductor region located over the substrate, wherein the III-nitride semiconductor region comprises a heterojunction comprising at least one two-dimensional carrier gas;
    a first terminal operatively connected to the III-nitride semiconductor region;
    a second terminal operatively connected to the III-nitride semiconductor region and laterally spaced from the first terminal;
    a gate structure located above the III-nitride semiconductor region and laterally spaced between the first and second terminals, the gate structure being a first conductivity type;
    a control gate terminal operatively connected to the gate structure, wherein a potential applied to the control gate terminal modulates and controls a current flow through the two-dimensional carrier gas between the first and second terminals, the at least one two-dimensional carrier gas being a second conductivity type;
    at least one injector of carriers of the first conductivity type laterally spaced away from the second terminal; and
    a floating contact layer located over the two dimensional carrier gas and operatively connected to, and in physical contact with, both the at least one injector and the III-nitride semiconductor region, wherein the floating contact layer is laterally spaced away from the second terminal; and
    the method comprising:
    forming the substrate;
    forming the III-nitride semiconductor region located over the substrate, wherein the III-nitride semiconductor region comprises a heterojunction comprising at least one two-dimensional carrier gas;
    forming the first terminal operatively connected to the III-nitride semiconductor region;
    forming the second terminal laterally spaced from the first terminal in a first dimension and operatively connected to the III-nitride semiconductor region;
    forming the control gate terminal on a gate structure, said gate structure being positioned above the III-nitride semiconductor region;
    forming the at least one injector of carriers of a first conductivity type laterally spaced away from the second terminal;
    forming the floating contact layer over the at least one two dimensional carrier gas, wherein the floating contact layer is operatively connected to, and in physical contact with, both the at least one injector and the III-nitride semiconductor region, and laterally spaced away from the second terminal;
    forming at least one injector of carriers of a first conductivity type laterally spaced away from the second terminal; and
    forming at least one operative connection between the at least one said injector and the floating contact layer.

* * * * *